(12) United States Patent
Kim et al.

(10) Patent No.: US 11,967,590 B2
(45) Date of Patent: Apr. 23, 2024

(54) DISPLAY DEVICE

(71) Applicant: Samsung Display Co., LTD., Yongin-si (KR)

(72) Inventors: Hyun Kim, Yongin-si (KR); Jong Chan Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 373 days.

(21) Appl. No.: 17/341,937

(22) Filed: Jun. 8, 2021

(65) Prior Publication Data

US 2022/0037302 A1    Feb. 3, 2022

(30) Foreign Application Priority Data

Jul. 31, 2020    (KR) .......................... 10-2020-0096229

(51) Int. Cl.
| | | |
|---|---|---|
| H01L 25/16 | (2023.01) | |
| G09F 9/33 | (2006.01) | |
| G09G 3/3233 | (2016.01) | |
| H01L 21/768 | (2006.01) | |
| H01L 25/075 | (2006.01) | |
| H01L 27/12 | (2006.01) | |
| H01L 27/15 | (2006.01) | |
| H01L 33/24 | (2010.01) | |
| H01L 33/50 | (2010.01) | |
| H01L 33/54 | (2010.01) | |
| H01L 33/60 | (2010.01) | |
| H01L 33/62 | (2010.01) | |

(Continued)

(52) U.S. Cl.
CPC ............ *H01L 25/167* (2013.01); *H01L 33/54* (2013.01); *H01L 33/60* (2013.01); *G09G 3/32* (2013.01); *G09G 2310/0267* (2013.01); *G09G 2310/0275* (2013.01)

(58) Field of Classification Search
CPC ............... H01L 25/0753; H01L 25/167; H01L 27/1214; G09G 3/32; G09F 9/33
See application file for complete search history.

(56) References Cited

U.S. PATENT DOCUMENTS 10,847,584 B2    11/2020   Yamaguchi et al.
2020/0091264 A1   3/2020   Lee et al.
(Continued)

FOREIGN PATENT DOCUMENTS

KR    10-2020-0008677    1/2020
KR    10-2020-0032594    3/2020
(Continued)

OTHER PUBLICATIONS

International Search Report corresponding to International Application No. PCT/KR2021/008730 dated Nov. 9, 2021.

*Primary Examiner* — Antonio B Crite
(74) *Attorney, Agent, or Firm* — KILE PARK REED & HOUTTEMAN PLLC

(57) ABSTRACT

A display device includes a substrate including pixels, a first electrode and a second electrode spaced apart from each other, light emitting elements disposed between the first electrode and the second electrode, an insulation layer disposed on the light emitting elements, a first bank overlapping the first electrode and the second electrode, a first area overlapping the first bank, and a second area excluding the first area, wherein the insulation layer includes an opening exposing the first area.

20 Claims, 15 Drawing Sheets

(51) Int. Cl.
   *G09G 3/32* (2016.01)
   *H01L 33/44* (2010.01)

(56) References Cited

U.S. PATENT DOCUMENTS

2021/0143137 A1   5/2021   Kim et al.
2021/0351171 A1   11/2021  Yoo et al.

FOREIGN PATENT DOCUMENTS

| KR | 10-2020-0034904 | 4/2020 | |
|----|-----------------|--------|---|
| KR | 10-2020-0077671 | 7/2020 | |
| KR | 10-2021-0057891 | 5/2021 | |
| WO | WO-2020071600 A1 * | 4/2020 | ........... G09G 3/2003 |
| WO | 2020/145462 | 7/2020 | |

* cited by examiner

DISPLAY DEVICE

CROSS-REFERENCE TO RELATED APPLICATION(S)

This application claims priority to and benefits of Korean Patent Application No. 10-2020-0096229 under 35 U.S.C. § 119, filed in the Korean Intellectual Property Office on Jul. 31, 2020, the entire contents of which are incorporated herein by reference.

BACKGROUND OF THE INVENTION

(a) Field of the Invention

The invention relates to a display device.

(b) Description of the Related Art

Interest in information display continues to increase. Accordingly, research and development on display devices is continuously being conducted.

SUMMARY OF THE INVENTION

The invention has been made in an effort to provide a display device that may improve front light emission efficiency.

Aspects of the invention are not limited to any mentioned above, and other technical aspects that are not mentioned may be clearly understood by a person of an ordinary skill in the art using the following description.

An embodiment may provide a display device that may include a substrate including pixels, a first electrode and a second electrode spaced apart from each other, light emitting elements disposed between the first electrode and the second electrode, an insulation layer disposed on the light emitting elements, a first bank overlapping the first electrode and the second electrode, a first area overlapping the first bank, and a second area excluding the first area, wherein the insulation layer includes an opening exposing the first area.

An edge of the opening of the insulation layer may be parallel to an upper surface of the substrate.

The opening of the insulation layer may expose the second electrode.

An edge of the opening of the insulation layer and an upper surface of the second electrode may be disposed on a same surface.

The display device may further include a second bank disposed at boundaries of the pixels, wherein an edge of the opening of the insulation layer and an upper surface of the second bank may be disposed on the same flat surface, and at least one of a color filter layer and a conversion layer may overlap at least one of the pixels.

The display device may further include a first contact electrode contacting the first electrode and an end of the light emitting element, and a second contact electrode contacting the second electrode and another end of the light emitting element.

A thickness of the first contact electrode in the first area may be greater than a thickness of the second contact electrode in the first area.

A thickness of the second contact electrode in the first area may be less than a thickness of the second contact electrode in the second area.

The opening of the insulation layer may expose the first contact electrode.

An edge of the opening of the insulation layer and an upper surface of the first contact electrode may be disposed on a same surface.

The opening of the insulation layer may expose the second contact electrode.

The insulation layer may include a first insulation layer disposed between the first contact electrode and the second contact electrode, and a second insulation layer disposed on the first contact electrode and the second contact electrode.

The opening of the first insulation layer may expose the first contact electrode.

The opening of the second insulation layer may expose the second contact electrode.

The opening of the second insulation layer may expose the second electrode.

An edge of the opening of the first insulation layer and an edge of the opening of the second insulation layer may be disposed on a same surface.

An edge of the opening of the first insulation layer and an edge of the opening of the second insulation layer may be parallel to an upper surface of the substrate.

The opening of the insulation layer may expose the first contact electrode and the second contact electrode.

An edge of the opening of the insulation layer, an upper surface of the first contact electrode, and an upper surface of the second contact electrode may be disposed on a same surface.

A thickness of the first contact electrode in the first area may be less than a thickness of the first contact electrode in the second area, and the thickness of the first contact electrode in the first area may be substantially same as a thickness of the second contact electrode in the first area.

Particularities of other embodiments are included in the detailed description and drawings.

According to an embodiment of the invention, as an edge of an opening of an insulation layer may be flatly formed by polishing, even if light incident to the insulation layer may be totally reflected in the inside thereof, since the light may be emitted from one end of the insulation layer, for example, from the edge of the opening toward a front side of a display panel, it may be possible to improve front light emission efficiency of a pixel.

Effects of embodiments of the invention are not limited by what is illustrated in the above, and more various effects are included in the specification.

DETAILED DESCRIPTION OF THE EMBODIMENTS

Figure 1:
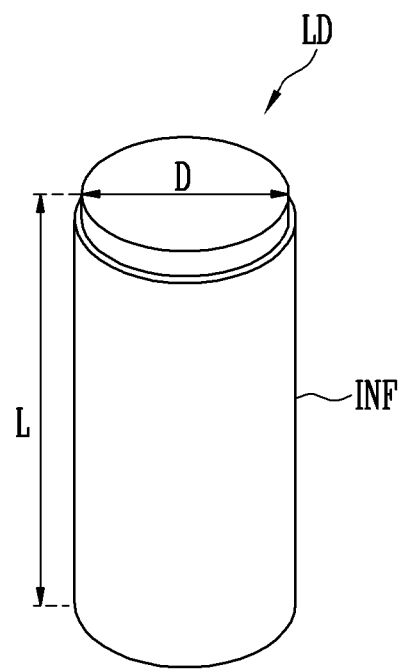
FIG. 1 and FIG. 2 illustrate a schematic perspective view and a schematic cross-sectional view of a light emitting element according to an embodiment, respectively.

Advantages and features of the invention and methods of accomplishing the same may be understood more readily by reference to the following detailed description of preferred embodiments and the accompanying drawings. The invention may, however, be embodied in different forms and should not be construed as limited to the embodiments set forth herein. The embodiments are provided so that this disclosure will be thorough and complete, and will fully convey the scope of the invention to those skilled in the art, and further, the scope of the invention is only defined by the claims including equivalents thereof.

The terms used herein are for the purpose of describing particular embodiments only and is not intended to be limiting. As used herein, the singular forms "a", "an" and "the" are intended to include the plural forms as well, unless the context clearly indicates otherwise. It will be further understood that terms such as "comprise", "comprising", "include", "including", "have" and "having", when used in the disclosure, specify the presence of stated elements, steps, operations, and/or devices, but do not preclude the presence or addition of one or more other elements, steps, operations, and/or devices.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being "on" another element or layer, it can be directly on another element or layer, or an intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements.

The term overlap may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

"About", "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
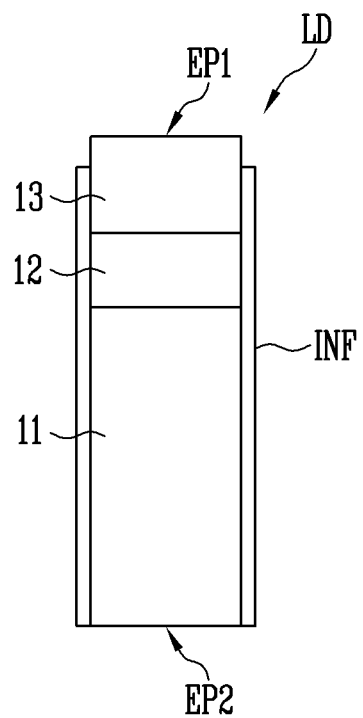
Figure 3:
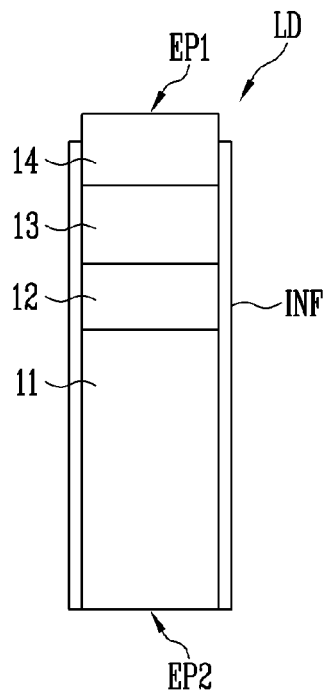
FIG. 3 and FIG. 4 illustrate schematic cross-sectional views of light emitting elements according to embodiments.
Figure 4:
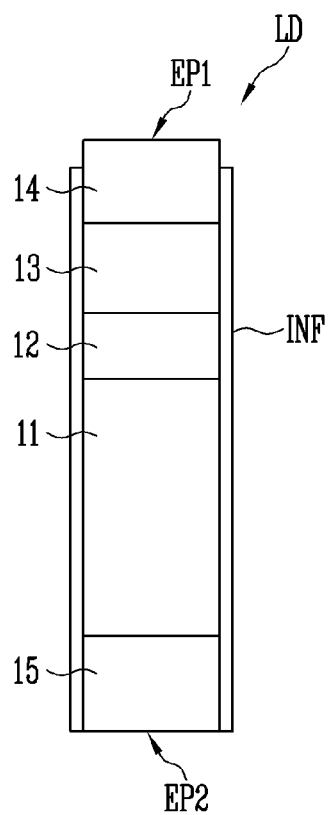

FIG. 1 and FIG. 2 illustrate a schematic perspective view and a schematic cross-sectional view of a light emitting element according to an embodiment, respectively. FIG. 3 and FIG. 4 illustrate schematic cross-sectional views of light emitting elements according to embodiments.

FIG. 1 to FIG. 4 illustrate a rod-like light emitting element LD of a circular cylinder shape, but a type and/or shape of the light emitting element LD is not limited thereto.

Referring to FIG. 1 to FIG. 4, the light emitting element LD may include a first semiconductor layer 11 and a second semiconductor layer 13, and an active layer 12 disposed (e.g., interposed) between the first and second semiconductor layers 11 and 13. For example, when an extending direction of the light emitting element LD is referred to as a length L direction, the light emitting element LD may include the first semiconductor layer 11, the active layer 12, and the second semiconductor layer 13 sequentially stacked on each other along the length L direction.

The light emitting element LD may be provided to have a rod shape extending along one direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD.

In some embodiments, the light emitting element LD may be a rod-shaped light emitting element (also referred to as a "rod-shaped light emitting diode") manufactured in a rod shape through an etching method or the like. In the specification, "rod shape" refers to a rod-like shape or bar-like shape (for example, with an aspect ratio greater than 1) that may be long in the length L direction, such as a circular cylinder or a polygonal cylinder, but a shape of a cross section thereof is not particularly limited. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may each have the diameter D (or width) and/or the length L ranging from a nano scale to a micro scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include an N-type semiconductor layer. For example, the first semiconductor layer 11 may include a semiconductor material of at least one of InAlGaN, GaN, AlGaN, InGaN, AlN, and InN, and may include a N-type semiconductor layer doped with a first conductive dopant such as Si, Ge, Sn, or the like. However, the material included in the first semiconductor layer 11 is not limited thereto, and the first semiconductor layer 11 may be made of various materials.

The active layer 12 may be disposed on the first semiconductor layer 11, and may be formed to have a single-quantum or multi-quantum well structure. A position of the active layer 12 may be variously changed according to a type of the light emitting element LD. The active layer 12 may emit light having a wavelength of about 400 nm to about 900 nm, and may have a double hetero-structure.

A clad layer (not shown) doped with a conductive dopant may be formed at an upper portion and/or a lower portion of the active layer 12. For example, the clad layer may be formed as an AlGaN layer or an InAlGaN layer. In some embodiments, a material such as AlGaN, AlInGaN, or a combination thereof, may be used to form the active layer 12, and in addition, various materials may form the active layer 12.

The second semiconductor layer 13 may be disposed on the active layer 12, and may include a semiconductor layer of a type different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may be formed of various materials.

In an embodiment, the first semiconductor layer 11 and the second semiconductor layer 13 may have different lengths (or thicknesses) in the length L direction of the light emitting element LD. For example, the first semiconductor layer 11 may have a longer length (or thicker thickness) than that of the second semiconductor layer 13 along the length L direction of the light emitting element LD. Accordingly, the active layer 12 of the light emitting element LD may be disposed closer to the first end portion EP1 than to the second end portion EP2.

In case that a voltage of a threshold voltage or more is applied to respective ends of the light emitting element LD, the light emitting element LD may emit light while electron-hole pairs may be combined in the active layer 12. By controlling the light emission of the light emitting element LD by using this principle, the light emitting element LD may be used as a light source for various light emitting devices in addition to pixels of a display device.

The light emitting element LD may further include an insulation film INF provided on a surface thereof. The insulation film INF may be formed on the surface of the light emitting element LD so as to surround at least an outer circumferential surface of the active layer 12, and may further surround a region of the first and second semiconductor layers 11 and 13.

In some embodiments, the insulation film INF may expose respective end portions of the light emitting element LD having different polarities. For example, the insulation film INF may not cover one end of each of the first and second semiconductor layers 11 and 13 disposed at ends of the light emitting element LD in the length direction, for example, two flat surfaces (for example, upper and lower surfaces) of the circular cylinder, but may expose it. In some embodiments, the insulation film INF may expose end portions of the light emitting element LD having different polarities and side portions of the semiconductor layers 11 and 13 adjacent to the end portions.

In some embodiments, the insulation film INF may be formed as a single layer or multilayer (for example, a double layer made of an aluminum oxide (AlOx) and a silicon oxide (SiOx)) by including at least one insulation material of a silicon oxide (SiOx), a silicon nitride (SiNx), an aluminum oxide (AlOx), and a titanium oxide (TiOx), but is not limited thereto. In some embodiments, the insulation film INF may be omitted.

In case that the insulation film INF is provided to cover a surface of the light emitting element LD, particularly, an external circumferential surface of the active layer 12, it may be possible to prevent the active layer 12 from being short-circuited with a first pixel electrode or a second pixel electrode to be described later. Accordingly, electrical stability of the light emitting element LD may be secured.

In case that the insulation film INF is provided on the surface of the light emitting element LD, it may be possible to improve life-span and efficiency thereof by minimizing surface defects of the light emitting element LD. Further, it may be possible to prevent an unwanted short circuit between the light emitting elements LD from occurring even in case that multiple light emitting elements LD may be disposed in close contact with each other.

In an embodiment, the light emitting element LD may further include an additional constituent element in addition to the first semiconductor layer 11, the active layer 12, the second semiconductor layer 13, and/or the insulation film INF surrounding them. For example, the light emitting element LD may additionally include one or more of a phosphor layer, an active layer, a semiconductor layer, and/or an electrode layer disposed on one end side of the first semiconductor layer 11, the active layer 12, and/or the second semiconductor layer 13.

For example, the light emitting element LD may further include an electrode layer 14 disposed at one end side of the second semiconductor layer 13 as shown in FIG. 3. The electrode layer 14 may be disposed at the first end portion EP1 of the light emitting element LD.

The light emitting element LD may further include another electrode layer 15 disposed at one end side of the first semiconductor layer 11 as shown in FIG. 4. For example, the electrode layers 14 and 15 may be disposed at the first and second end portions EP1 and EP2 of the light emitting element LD. The electrode layers 14 and 15 may be an ohmic contact electrode, but are not limited thereto. For example, the electrode layers 14 and 15 may be a short Schottky contact electrode. The electrode layers 14 and 15 may include a metal, metal oxide, or a combination thereof. For example, the electrode layers 14 and 15 may be formed by singly using or mixing chromium (Cr), titanium (Ti), aluminum (Al), gold (Au), nickel (Ni), an oxide thereof or alloy thereof, and ITO. Materials included in each of the electrode layers 14, and 15 may be the same or different from each other. The electrode layers 14, and 15 may be substantially transparent or translucent. Accordingly, light generated by the light emitting element LD may pass through the electrode layers 14 and 15 and may be emitted outside of the light emitting element LD. In another embodiment, in case that the light generated by the light emitting element LD does not transmit through the electrode layers 14 and 15 and is emitted outside of the light emitting element LD through a region excluding respective end portions of the light emitting element LD, the electrode layers 14 and 15 may include an opaque metal.

Figure 5:
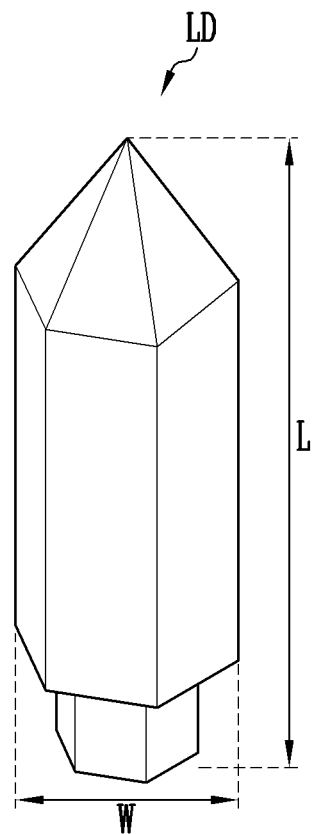
FIG. 5 and FIG. 6 illustrate a schematic perspective view and a schematic cross-sectional view of a light emitting element according to another embodiment.
Figure 6:
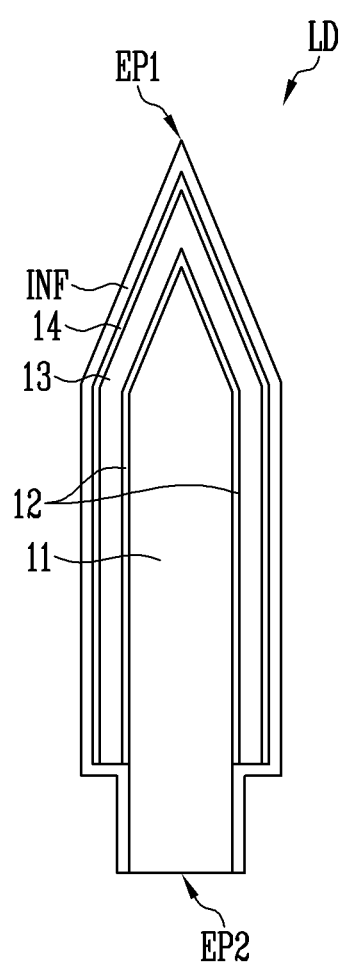

FIG. 5 and FIG. 6 illustrate a schematic perspective view and a schematic cross-sectional view of a light emitting element according to another embodiment.

FIGS. 5 and 6 illustrate a light emitting element LD having a structure different from the light emitting elements LD shown in FIG. 1 to FIG. 4, for example, a light emitting element having a core-shell structure. For example, a type, structure, and/or shape of the light emitting element LD may be variously changed. In an embodiment of FIG. 5 and FIG. 6, the same reference numerals are denoted to similar or same constituent elements (for example, constituent elements corresponding to each other) as those of FIG. 1 to FIG. 4, and detailed descriptions thereof will be omitted.

Referring to FIG. 5 and FIG. 6, the light emitting element LD may include a first semiconductor layer 11 and a second semiconductor layer 13, and an active layer 12 interposed between the first and second semiconductor layers 11 and 13. According to an embodiment, the first semiconductor layer 11 may be disposed in a central area of the light emitting element LD, and the active layer 12 may be disposed on the surface of the first semiconductor layer 11 to surround at least one region of the first semiconductor layer 11. The second semiconductor layer 13 may be disposed on a surface of the active layer 12 to surround at least one region of the active layer 12.

The light emitting element LD may further include an electrode layer 14 surrounding at least one region of the second semiconductor layer 13, and/or an insulation film INF disposed on an outermost surface of the light emitting element LD. For example, the light emitting element LD may include the electrode layer 14 disposed on a surface of the second semiconductor layer 13 so as to surround at least one region of the second semiconductor layer 13, and the insulation film INF disposed on a surface of the electrode layer 14 so as to surround at least one region of the electrode layer 14.

In some embodiments, the insulation film INF may be provided on the surface of the light emitting element LD to cover a portion of an external circumferential surface of the first semiconductor layer 11 and an external circumferential surface of the electrode layer 14. In an embodiment, after the insulation film INF is first formed to cover the entire outer circumferential surface of the electrode layer 14 included in the light emitting element LD, the insulation film INF may be partially removed to expose an area of the electrode layer 14 for electrical connection to a pixel electrode (ELT1, ELT2 of FIG. 8). The insulation film INF may include a transparent insulation material.

The light emitting element LD may be a light emitting element having a core-shell structure (also referred to as a "core-shell light emitting diode") manufactured through a growth method or the like. For example, the light emitting element LD may have a core-shell structure including the first semiconductor layer 11, the active layer 12, the second semiconductor layer 13, the electrode layer 14, and the insulation film INF sequentially disposed from a center to an outer direction. In some embodiments, at least one of the electrode layer 14 and the insulation film INF of the light emitting element LD may be omitted.

In an embodiment, the light emitting element LD may have a polygonal horn shape extending along one direction. For example, at least one area of the light emitting element LD may have a hexagonal horn shape. However, the shape of the light emitting element LD may be variously changed according to embodiments.

In case that the extending direction of the light emitting element LD is the length L direction, the light emitting element LD may have a first end portion EP1 and a second end portion EP2 along the length L direction. One of the first and second semiconductor layers 11 and 13 (or an electrode layer surrounding one of the first and second semiconductor layers 11 and 13) may be disposed at the first end portion EP1 of the light emitting element LD, and the other one of the first and second semiconductor layers 11 and 13 (or an electrode layer surrounding the other of the first and second semiconductor layers 11 and 13) may be disposed at the second end portion EP2 of the light emitting element LD.

In an embodiment, the light emitting element LD may have a core-shell structure in which the first end portion EP1 protrudes in a shape of a polygonal horn (for example, a shape of a hexagonal horn), and for example, the light emitting element LD may have a shape in which a hexagonal horn and a hexagonal column are combined. The light emitting element LD may be a light emitting diode having an ultra-small size, and may have a size as small as nano-scale or micro-scale. For example, the light emitting element LD may have a width W and/or a length L of a nano-scale or micro-scale range, but is not limited thereto. For example, the size and shape of the light emitting element LD may be variously changed according to design conditions of various devices using the light emitting element LD as a light source, for example, a display device.

In an embodiment, end portions of the first semiconductor layer 11 may have a shape protruding along the length L direction of the light emitting element LD. The protruding shapes of end portions of the first semiconductor layer 11 may be different from each other. For example, one end portion disposed at an upper side of end portions of the first semiconductor layer 11 may have a horn shape (for example, a hexagonal horn shape) contacting one vertex as a width thereof narrows toward an upper portion. The other end portion disposed at a lower side of end portions of the first semiconductor layer 11 may have a polygonal column shape (for example, a hexagonal column shape) having a constant width, but is not limited thereto. For example, in another embodiment, the first semiconductor layer 11 may have a cross section of a polygonal shape or a step shape, which gradually decreases in width as it goes downward. For example, the shapes of end portions of the first semiconductor layer 11 may be variously changed according to embodiments.

The first semiconductor layer 11 may be disposed at a core of the light emitting element LD, for example, at a center (or central area). The light emitting element LD may be provided to have a shape corresponding to a shape of the first semiconductor layer 11. For example, in case that the first semiconductor layer 11 has a hexagonal horn shape at one end portion of an upper side thereof, the light emitting element LD may have a hexagonal horn shape at one end portion (for example, the first end portion EP1) of an upper side thereof.

The active layer 12 may be provided and/or formed to surround the outer circumferential surface of the first semiconductor layer 11. For example, the active layer 12 may be provided and/or formed to surround a remaining area excluding an end portion of one side of the first semiconductor layer 11 (for example, one end portion of a lower side of the first semiconductor layer 11) in the length L direction of the light emitting element LD.

The second semiconductor layer 13 may be provided and/or formed to surround the outer circumferential surface of the active layer 12, and may include a semiconductor layer of a different type from the first semiconductor layer 11. For example, in case that the first semiconductor layer 11 includes an N-type semiconductor layer, the second semiconductor layer 13 may include a P-type semiconductor layer.

In an embodiment, the light emitting element LD may further include an electrode layer 14 surrounding an outer circumferential surface of the second semiconductor layer 13. The electrode layer 14 may be an ohmic contact electrode or a Schottky key contact electrode electrically connected to the second semiconductor layer 13, but is not limited thereto.

A light emitting device including the light emitting element LD described above may be used in various types of devices that require a light source in addition to a display device. For example, multiple light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

In an embodiment, each pixel may include at least one rod-like light emitting element LD or at least one core-shell structured light emitting element LD, or may include a combination of a rod-like light emitting element LD and a core-shell structured light emitting element LD. In another embodiment, each pixel may include another light emitting element having a different type and/or shape from that of the rod-like light emitting element LD or the core-shell structured light emitting element LD.

Figure 7:
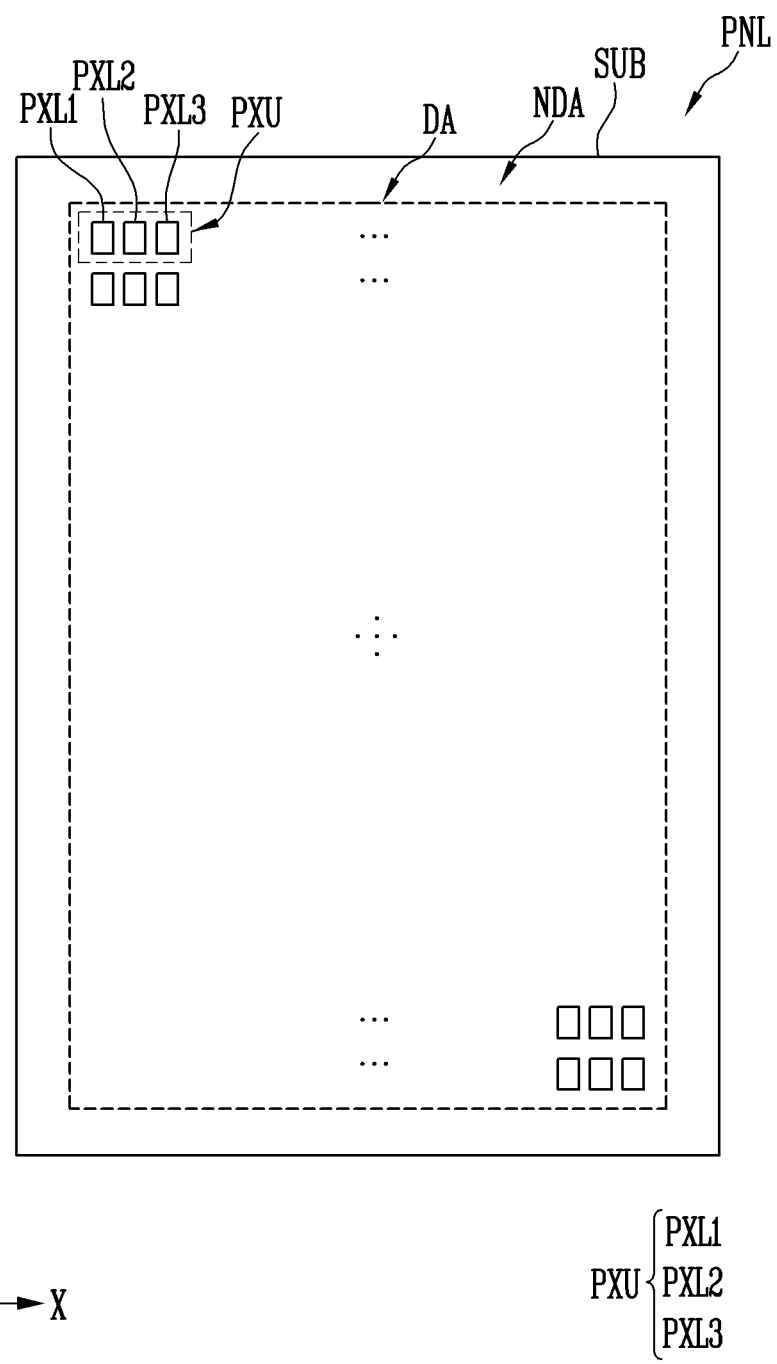
FIG. 7 illustrates a schematic top plan view of a display device according to an embodiment.

FIG. 7 illustrates a schematic top plan view of a display device according to an embodiment.

FIG. 7 illustrates a display device, in particular, a display panel PNL provided in the display device as an example of an electronic device that may use the light emitting element LD described in the embodiments of FIG. 1 to FIG. 6 as a light source. For example, each pixel unit PXU of the display panel PNL and each pixel configuring the same may include at least one light emitting element LD.

For convenience, FIG. 7 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 7, the display panel PNL may include a substrate SUB and the pixel unit PXU disposed on the substrate SUB. The pixel unit PXU may include first pixels PXL1, second pixels PXL2, and/or third pixels PXL3. Hereinafter, when arbitrarily referring to one or more pixels among the first pixels PXL1, the second pixels PXL2, and the third pixels PXL3, or when comprehensively referring to two or more types of pixels, they will be referred to as a "pixel PXL" or "pixels PXL".

The substrate SUB may configure a base member of the display panel PNL, and may be a rigid or flexible substrate or film. For example, the substrate SUB may be a hard substrate made of glass or tempered glass, a flexible substrate (or a thin film) made of a plastic or metallic material, or at least one layered insulation layer. The material and/or physical properties of the substrate SUB are not particularly limited.

In an embodiment, the substrate SUB may be substantially transparent. Here, "substantially transparent" may mean that light may be transmitted at a transmittance or more. In another embodiment, the substrate SUB may be translucent or opaque. The substrate SUB may include a reflective material according to an embodiment.

The display panel PNL and the substrate SUB for forming the display panel may include a display area DA for displaying an image and a non-display area NDA excluding the display area DA.

The pixels PXL may be disposed in the display area DA. In the non-display area NDA, various wires connected to the pixels PXL of the display area DA, pads, and/or internal circuit parts may be disposed. The pixels PXL may be regularly arranged according to a stripe or pentile arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one first pixel PXL1, at least one second pixel PXL2, and at least one third pixel PXL3 disposed adjacent to each other may configure one pixel unit PXU that may emit light of various colors. For example, each of the first pixel PXL1, the second pixel PXL2, and the third pixel PXL3 may be a sub-pixel emitting light of a color. In some embodiments, the first pixel PXL1 may be a red pixel that emits red light, the second pixel PXL2 may be a green pixel that emits green light, and the third pixel PXL3 may be a blue pixel that emits blue light, but the invention is not limited thereto.

In an embodiment, the first pixel PXL1, the second pixel PXL2, and the third pixel PXL3 may be each provided with a first color light emitting element, a second color light emitting element, and a third color light emitting element as a light source, respectively, so that they respectively emit light of the first color, second color, and third color. In another embodiment, the first pixel PXL1, the second pixel PXL2, and the third pixel PXL3 may be provided with light emitting elements of the same color, and include color conversion layers and/or color filters of different colors disposed on respective light emitting elements, so that they may emit light of the first color, the second color, and the third color, respectively. However, the color, type, and/or number of pixels PXL configuring each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting element LD according to one of the embodiments of FIG. 1 to FIG. 4, for example, ultra-small rod-shaped light emitting elements LD having a size as small as nanoscale to microscale, and/or at least one light emitting element LD according to an embodiment of FIG. 4 and FIG. 6, for example, ultra-small core-shell structured light emitting elements LD having a size as small as nanoscale to microscale. However, the invention is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

FIG. 8 to FIG. 11 illustrate schematic circuit diagrams of a pixel according to embodiments. FIG. 8 to FIG. 11 illustrate an embodiment of the pixel PXL applicable to an active display device. However, the types of the pixel PXL and of the display device are not limited thereto.

In some embodiments, the pixel PXL shown in FIG. 8 to FIG. 11 may be one or more of the first pixel PXL1, the second pixel PXL2, and the third pixel PXL3 provided in the display panel PNL of FIG. 7. The first pixel PXL1, the second pixel PXL2, and the third pixel PXL3 may have substantially the same or similar structure.

Figure 8:
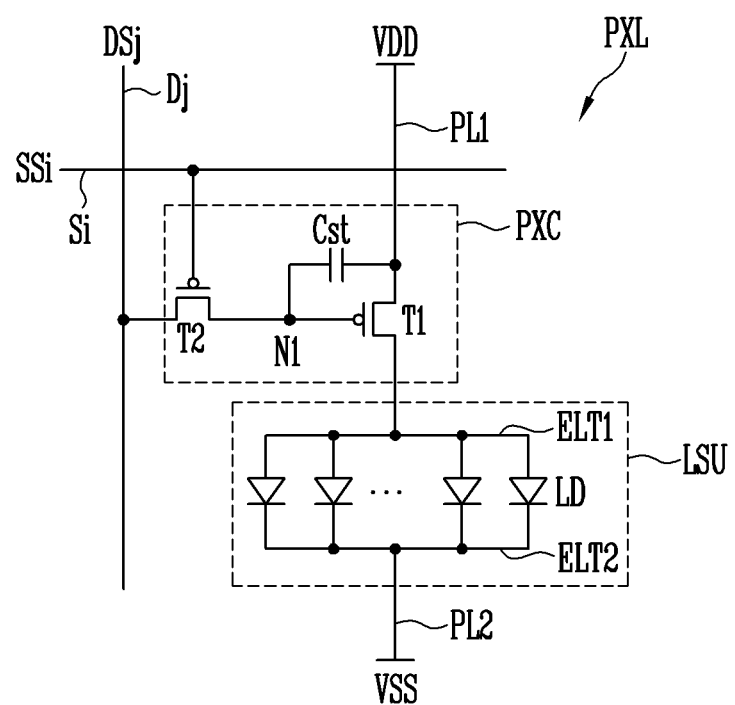
FIG. 8 to FIG. 11 illustrate schematic circuit diagrams of a pixel according to embodiments.

First, referring to FIG. 8, the pixel PXL may include a light source unit LSU for generating light at luminance corresponding to a data signal, and a pixel circuit PXC for driving the light source unit LSU.

The light source unit LSU may include at least one light emitting element LD connected between a first power source VDD and a second power source VSS, for example, light emitting elements LD. For example, the light source unit LSU may include a first electrode ELT1 (also referred to as a "first pixel electrode" or "first alignment electrode") connected to the first power VDD via the pixel circuit PXC and a first power line PL1, a second electrode ELT2 (also referred to as a "second pixel electrode" or "second alignment electrode") connected to the second power VSS through a second power line PL2, and light emitting elements LD connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a P-type end portion) connected to the first power source VDD through the first electrode ELT1 and/or the pixel circuit PXC, and a second end portion (for example, an N-type end portion) connected to the second power source VSS through the second electrode ELT2. For example, the light emitting elements LD may be connected in parallel in a forward direction between the first and second electrodes ELT1 and ET2. Respective light emitting elements LD connected in the forward direction between the first power source VDD and the second power source VSS may configure respective effective light sources, and these effective light sources may be combined to configure the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. A potential difference between the first and second power source sources VDD and VSS may be set to be equal to or higher than a threshold voltage of the light emitting elements LD during at least a light emitting period of the pixel PXL.

An end portion (for example, P-type end portion) of the light emitting elements LD configuring each light source unit LSU may be commonly connected to the pixel circuit PXC through one electrode (for example, the first pixel electrode ET1 of each pixel PXL) of the light source unit LSU, and may be connected to the first power source VDD through the pixel circuit PXC and the first power line PL1. Other end portions (for example, N-type end portions) of the light emitting elements LD may be commonly connected to the second power source VSS through another electrode (for example, the second electrode ELT2 of each pixel PXL) of the light source unit LSU and the second power wire PL2.

The light emitting elements LD may emit light with luminance corresponding to a driving current supplied through the corresponding pixel circuit PXC. For example, during each frame period, the pixel circuit PXC may supply a driving current corresponding to a gray value to be displayed in the corresponding frame to the light source unit LSU. The driving current supplied to the light source unit LSU may be divided to flow in the light emitting elements LD that may be connected in a forward direction. Therefore, while each light emitting element LD emits light with a luminance corresponding to the current flowing therein, the light source unit LSU may emit light having a luminance corresponding to the driving current.

The pixel circuit PXC may be connected between the first power source VDD and the first electrode ELT1. The pixel circuit PXC may be connected to a scan line Si and a data line Dj of the pixel PXL. For example, in case that the pixel PXL is disposed in an i-th horizontal line (row) (i may be a natural number) and a j-th vertical line (column) (j may be a natural number) of the display area DA, the pixel circuit PXC of the pixel PXL may be connected to an i-th scan line Si and a j-th data line Dj of the display area DA.

In some embodiments, the pixel circuit PXC may include transistors and at least one capacitor. For example, the pixel circuit PXC may include a first transistor T1, a second transistor T2, and a storage capacitor Cst.

The first transistor T1 may be connected between the first power source VDD and the light source unit LSU. For example, a first electrode (for example, a source electrode) of the first transistor T1 may be connected to the first power source VDD, and a second electrode (for example, a drain electrode) of the first transistor T1 may be connected to the first electrode ELT1. A gate electrode of the first transistor T1 may be connected to a first node N1. The first transistor T1 may control a driving current supplied to the light source unit LSU in response to a voltage of the first node N1. For example, the first transistor T1 may be a driving transistor that controls a driving current of the pixel PXL.

The second transistor T2 may be connected between the data line Dj and the first node N1. For example, a first electrode (for example, a source electrode) of the second transistor T2 may be connected to the data line Dj, and a second electrode (for example, a drain electrode) of the second transistor T2 may be connected to the first node 1. A gate electrode of the second transistor T2 may be connected to the scan line Si. In case that a scan signal SSi of a gate-on voltage (for example, a low level voltage) is supplied from the scan line Si, the second transistor T2 may be turned on to electrically connect the data line Dj and the first node N1.

For each frame period, a data signal DSj of the corresponding frame may be supplied to the data line Dj, and the data signal DSj may be transmitted to the first node N1 through the turned-on transistor T2 during a period in which the scan signal SSi of the gate-on voltage may be supplied. For example, the second transistor T2 may be a switching transistor for transmitting each data signal DSj to the inside of the pixel PXL.

One electrode of the storage capacitor Cst may be connected to the first power source VDD, and the other electrode thereof may be connected to the first node N1. The storage capacitor Cst may be charged with a voltage the corresponding to the data signal DSj supplied to the first node N1 during each frame period.

In FIG. 8, the transistors included in the pixel circuit PXC, for example, the first and second transistors T1 and T2 are all illustrated as P-type transistors, but are not necessarily limited thereto, and a least one of the first and second transistors T1 and T2 may be changed to an N-type transistor. The pixel circuit PXC may be configured as a pixel circuit having various structures and/or driving methods.

Figure 9:
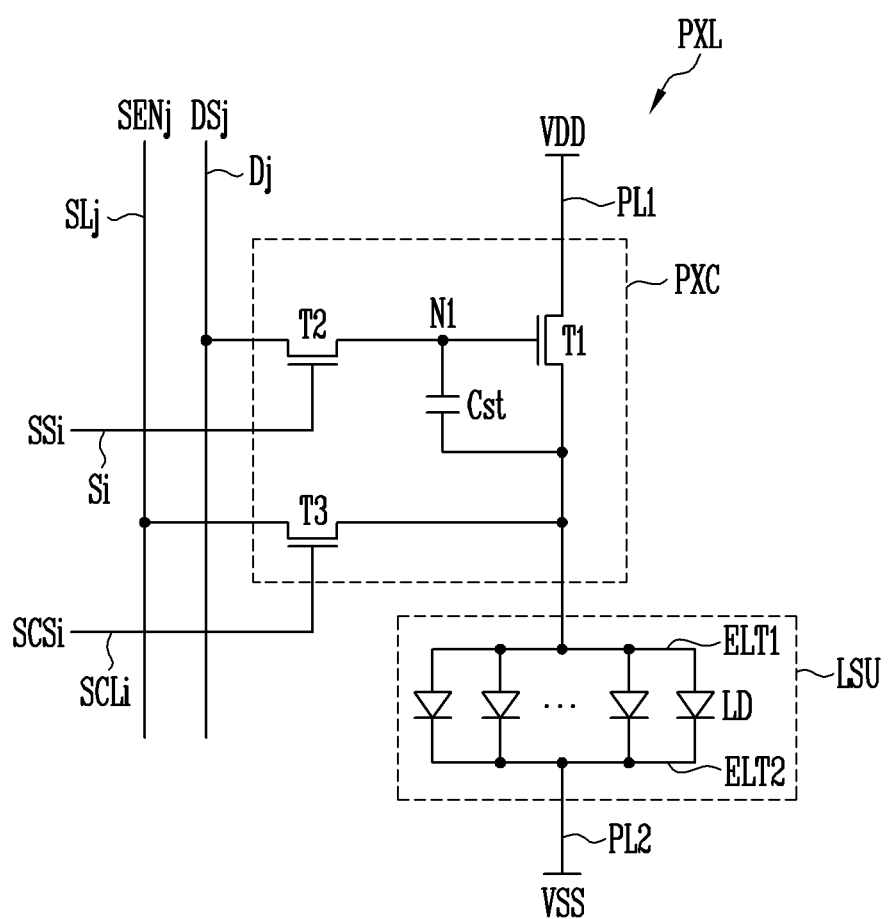

Referring to FIG. 9, the pixel circuit PXC may be further connected to a sensing control line SCLi and a sensing line SLj. For example, the pixel circuit PXC of the pixel PXL disposed at an i-th horizontal line and a j-th vertical line of the display area DA may be connected to an i-th sensing control line SCLi and a j-th sensing line SLj of the display area DA. The pixel circuit PXC may further include a third transistor T3. In another embodiment, the sensing line SLj may be omitted, and the characteristics of the pixel PXL may also be detected by detecting a sensing signal SENj through the data line Dj of the corresponding pixel PXL (or adjacent pixel), The third transistor T3 may be connected between the first transistor T1 and the sensing line SLj. For example, one electrode of the third transistor T3 may be connected to one electrode (for example, a source electrode) of the first transistor T1 connected to the first electrode ELT1, and the other electrode thereof may be connected to the sensing line SLj. In case that the sensing line SLj is omitted, the other electrode of the third transistor T3 may also be connected to the data line Dj.

A gate electrode of the third transistor T3 may be connected to the sensing control line SCLi. In case that the sensing control line SCLi is omitted, the gate electrode of the third transistor T3 may be connected to the scan line Si. The third transistor T3 may be turned on by a sensing control signal SCSi of a gate-on voltage (for example, a high level voltage) supplied to the sensing control line SCLi during a sensing period to electrically connect the sensing line SLj and the first transistor T1.

In some embodiments, the sensing period may be a period for extracting characteristics (for example, a threshold voltage of the first transistor T1) of each of the pixels PXL disposed in the display area DA. During the sensing period, the first transistor T1 may be turned on by supplying a reference voltage at which the first transistor T1 may be turned on to the first node N1 through the data line Dj and the second transistor T2 and by connecting each pixel PXL to a current source or the like. By supplying the sensing control signal SCSi of a gate-on voltage to the third transistor T3 to turn on the third transistor T3, the first transistor T1 may be connected to the sensing line SLj. Thereafter, the sensing signal SENj may be obtained through the sensing line SLj, and the characteristics of each pixel PXL in addition to the threshold voltage of the first transistor T1 may be detected by using the sensing signal SENj. Information on the characteristics of each pixel PXL may be used to convert image data so that a characteristic difference between the pixels PXL disposed in the display area DA may be compensated.

FIG. 9 illustrates an embodiment in which the first, second, and third transistors T1, T2, and T3 may be all N-type transistors, but the invention is not limited thereto. For example, at least one of the first, second, and third transistors T1, T2, and T3 may be changed to a P-type transistor.

Figure 10:
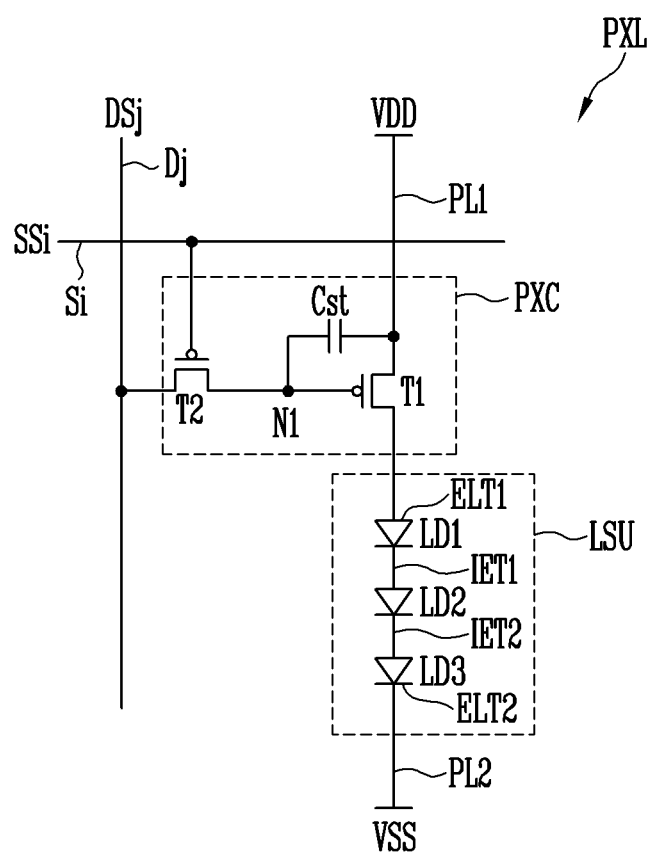
Figure 11:
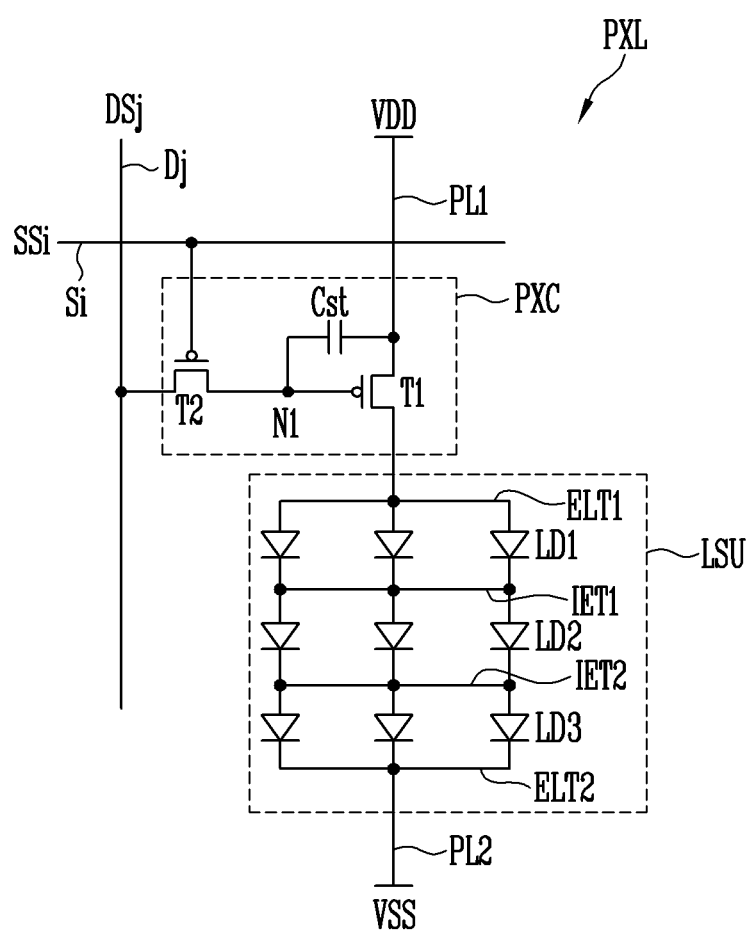

FIG. 8 and FIG. 9 illustrate embodiments in which effective light sources forming each light source unit LSU, for example, the light emitting elements LD may be all connected in parallel, but the invention is not necessarily limited thereto. For example, as shown in FIG. 10 and FIG. 11, the light source unit LSU of each pixel PXL may be configured to include at least two stages in series. In describing embodiments of FIG. 10 and FIG. 11, a detailed description of the configuration (for example, the pixel circuit PXC) that may be similar to or the same as the embodiments of FIG. 8 and FIG. 9 will be omitted.

Referring to FIG. 10, the light source unit LSU may include at least two light emitting elements connected in series to each other. For example, the light source unit LSU may include a first light emitting element LD1, a second light emitting element LD2, and a third light emitting element LD3 that may be connected in series in a forward direction between the first power source VDD and the second power source VSS. Each of the first, second, and third light emitting elements LD1, LD2, and LD3 may configure an effective light source.

Hereinafter, when referring to a specific light emitting element among the first, second, and third light emitting elements LD1, LD2, and LD3, the corresponding light emitting element may be referred to as a "first light emitting element LD1", "second light emitting element LD2", or "third light emitting element LD3". When arbitrarily referring to at least one light emitting element among the first, second, and third light emitting elements LD1, LD2, and LD3, or generically referring to the first, second, and third light emitting elements LD1, LD2, and LD3, it will be referred to as "light emitting element LD" or "light emitting elements LD".

A first end portion (for example, P-type end portion) of the first light emitting element LD1 may be connected to the first power source VDD via the first electrode ELT1 (for example, first pixel electrode) of the light source unit LSU. A second end portion (for example, N-type end portion) of the first light emitting element LD1 may be connected to a first end portion (for example, P-type end portion) of the second light emitting element LD2 through a first middle electrode IET1.

The first end portion of the second light emitting element LD2 may be connected to a second end portion of the first light emitting element LD1. The second end portion (for example, N-type end) of the second light emitting element LD2 may be connected to a first end portion (for example, P-type end portion) of the third light emitting element LD3 through a second middle electrode IET2.

The first end portion of the third light emitting element LD3 may be connected to a second end portion of the second light emitting element LD2. A second end portion of the third light emitting element LD3 (for example, N-type end portion) may be connected to the second power supply VSS via the second electrode (for example, second pixel electrode ELT2) of the light source unit LSU. In the above-described manner, the first, second, and third light emitting elements LD1, LD2, and LD3 may be sequentially connected in series between the first and second electrodes ELT1 and ELT2 of the light source unit LSU.

FIG. 10 illustrates an embodiment of connecting the light emitting elements LD in a three-stage serial structure, but the invention is not limited thereto, and two light emitting elements LD may be connected in a two-stage serial structure, or four or more of light emitting elements LD may be connected in a series structure of four or more stages.

Assuming that the same luminance is expressed using the light emitting elements LD of the same condition (for example, the same size and/or number), in the light source unit LSU having a structure in which the light emitting elements LD may be connected in series compared to the light source unit LSU having a structure in which the light emitting elements LD may be connected in parallel, a voltage applied between the first and second electrodes ELT1 and ELT2 may increase, a driving current flowing through the light source unit LSU may decrease. Therefore, in case that the light source unit LSU of each pixel PXL is configured by applying the serial structure, a panel current flowing through the display panel PNL may be reduced.

In an embodiment, at least one serial stage may include a plurality of light emitting elements LD connected in parallel to each other. The light source unit LSU may be configured in a series/parallel mixed structure. For example, the light source unit LSU may be configured as in an embodiment of FIG. 11.

Referring to FIG. 11, at least one serial stage configuring the light source unit LSU may include light emitting elements LD connected in parallel in a forward direction. For example, the light source unit LSU may include at least one first light emitting element LD1 disposed at a first serial stage (also referred to as a "first stage"), at least one second light emitting element LD2 disposed in a second serial stage (also referred to as a "second stage") subsequent to the first serial stage, and at least one third light emitting element LD3 disposed in a third serial stage (also referred to as "third stage") subsequent to the second serial stage. At least one of the first, second, and third serial stages may include light emitting elements LD connected in a forward direction.

FIG. 11 illustrates the light source unit LSU configured of light emitting elements LD disposed at three serial stages, but the invention is not limited thereto, and the number of serial stages configuring the light source unit (LSU) and/or the number of light emitting elements LD connected to each serial stage in a forward direction may be variously changed.

In some embodiments, the pixels PXL disposed in the display area DA may include the same or similar number of light emitting elements LD. For example, in a step of supplying the light emitting elements LD to each pixel PXL, by controlling a light emitting element ink (also referred to as a "light emitting element solution") including the light emitting elements LD to be applied in a uniform amount to the light-emitting area of each pixel PXL, and by controlling a uniform electric field to be applied to each pixel PXL, the light emitting elements LD may be arranged. Accordingly, it may be possible to relatively uniformly supply and arrange the light emitting elements LD to pixels PXL.

As in the above-described embodiment, each light source unit LSU may be connected to the first and second power sources VDD and VSS in a forward direction to be able to include light emitting elements LD configuring each effective light source. The connection structure between the light emitting elements LD may be variously changed according to embodiments. For example, the light emitting elements LD may be connected to each other only in series or in parallel, or may be connected in a series/parallel mixed structure.

Figure 12:
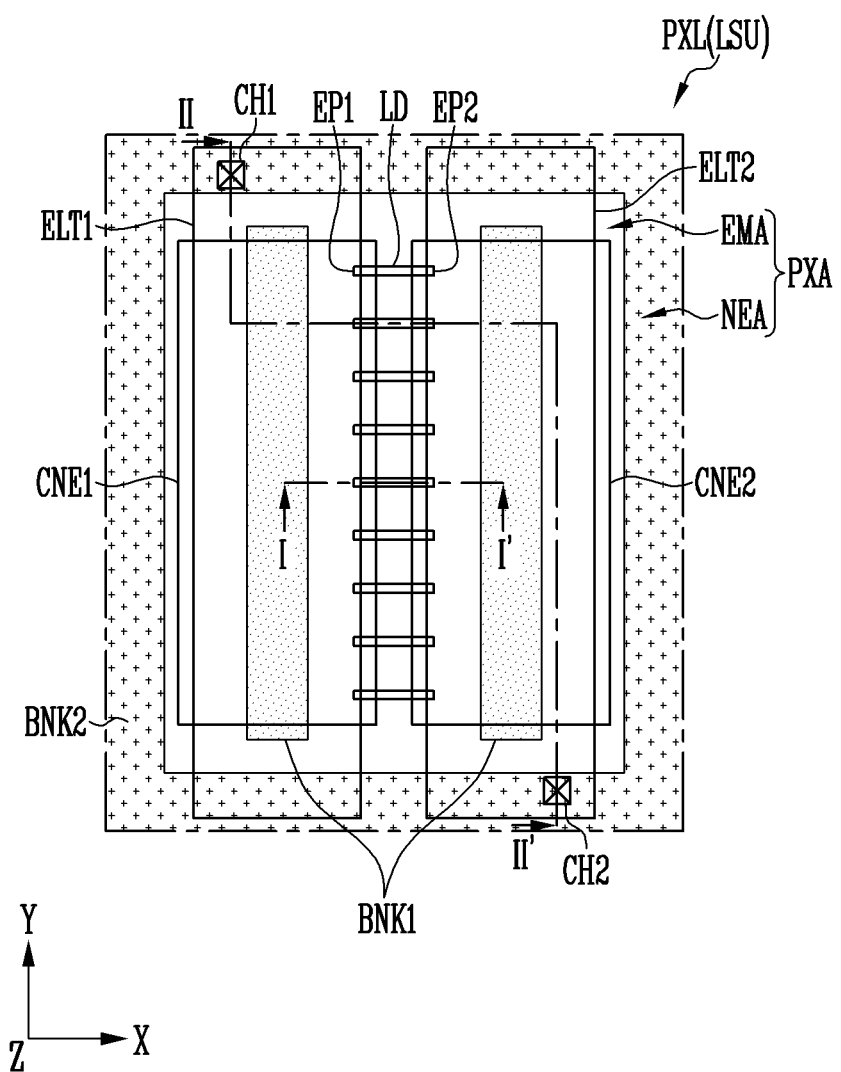
FIG. 12 illustrates a schematic top plan view of a pixel according to an embodiment.

FIG. 12 illustrates a schematic top plan view of a pixel according to an embodiment.

In FIG. 12, a structure of the pixel PXL is illustrated based on the light source unit LSU of each pixel PXL. FIG. 12 illustrates an embodiment in which each light source unit LSU may be connected to a power line (for example, the first and/or second power lines PL1 and PL2), a circuit element (for example, at least one circuit element configuring the pixel circuit PXC), and/or a signal line (for example, the scan line Si and/or the data line Dj), through first and second contact holes CH1 and CH2. However, the invention is not necessarily limited thereto, and at least one of the first and second electrodes ELT1 and ELT2 of each pixel PXL may be directly connected to a power line and/or signal line without passing through a contact hole and/or a middle line.

First, referring to FIG. 12, the pixel PXL may include the first electrode ELT1 and the second electrode ELT2 disposed in each light emitting area EMA, and at least one light emitting element LD (for example, multiple light emitting elements LD connected in parallel between the first and second electrodes ELT1 and ELT2) disposed between the first and second electrodes ELT1 and ELT2. The pixel PXL may further include a first contact electrode CNE1 and a second contact electrode CNE2 for electrically connecting the light emitting element LD between the first and second electrodes ELT1 and ELT2.

The first electrode ELT1 and the second electrode ELT2 may be disposed in each pixel area in which each PXL may be provided and/or formed. For example, the first electrode ELT1 and the second electrode ELT2 may be disposed in the light emitting area EMA of each pixel PXL.

In some embodiments, each pixel area PXA may generally mean a pixel circuit area in which circuit elements for configuring the corresponding pixel PXL may be disposed, a light emitting area EMA in which the light source unit LSU of the pixel PXL may be disposed, and non-emitting area NEA. The light-emitting area EMA may be an area in which the light emitting elements LD (in particular, effective light sources connected in a forward direction between the first and second electrodes ELT1 and ELT2) configuring the light source unit LSU of each pixel PXL may be disposed. One area of electrodes connected to the light emitting elements LD (for example, the first and second electrodes ELT1 and ELT2 and/or the first and second contact electrodes CNE1 and CNE2) or of the above-mentioned electrodes may be disposed in the light emitting area EMA.

The first and second electrodes ELT1, and ELT2 may be disposed apart from each other. For example, the first and second electrodes ELT1 and ELT2 may be spaced apart side by side by an interval along a first direction (X-axis direction) in each light emitting area EMA. In an embodiment, the first direction (X-axis direction) may be a horizontal direction (or row direction), but the configuration is not limited thereto.

In some embodiments, the first and/or second electrodes ELT1 and ELT2 may have a pattern separated for each pixel PXL or a pattern that may be commonly connected to multiple pixels PXL. On the other hand, before the process of forming the pixel PXL, particularly before the alignment of the light emitting elements LD may be completed, the first electrodes ELT1 of the pixels PXL disposed in the display area DA may be connected to each other, and the second electrodes ELT2 of the pixels PXL may be connected to each other. For example, before the alignment of the light emitting elements LD may be completed, the first electrodes ELT1 of the pixels PXL may be formed integrally or non-integrally with each other and may be electrically connected to each other, and the second electrodes ELT2 of the pixels PXL may be formed integrally or non-integrally with each other and may be electrically connected to each other. In case that the first electrodes ELT1 or the second electrodes ELT2 of the pixels PXL are non-integrally connected to each other, the first electrodes ELT1 or the second electrodes ELT2 may be electrically connected to each other by at least one contact hole and/or bridge pattern.

The first and second electrodes ELT1 and ELT2 may receive a first alignment signal (or first alignment voltage)

and a second alignment signal (or second alignment voltage), respectively, in an alignment step of the light emitting elements LD. For example, one of the first and second electrodes ELT1 and ELT2 may be supplied with an AC-type alignment signal, and the other of the first and second electrodes ELT1 and ELT2 may be supplied with an alignment voltage (for example, a ground voltage) having a constant voltage level.

For example, an alignment signal may be applied to the first and second electrodes ELT1 and ELT2 in the alignment step of the light emitting elements LD. Accordingly, an electric field may be formed between the first and second electrodes ELT1 and ELT2. The light emitting elements LD provided in each pixel area (particularly, the light emitting area EMA of each pixel PXL) may be self-aligned between the first and second electrodes ELT1 and ELT2 by the electric field. After the alignment of the light emitting elements LD is completed, by disconnecting the first electrodes ELT1 between the pixels PXL, the pixels PXL may be formed in a form capable of being individually driven.

The first and second electrodes ELT1 and ELT2 may have various shapes. For example, each of the first and second electrodes ELT1 and ELT2 may have a bar shape extending along a second direction (Y-axis direction) crossing (for example, orthogonal to) the first direction (X-axis direction). However, a configuration is not necessarily limited thereto, and the shape and/or structure of the first and second electrodes ELT1 and ELT2 may be variously changed. For example, the first electrode ELT1 and/or second electrode ELT2 may be formed as a spiral or circular electrode.

FIG. 12 illustrates an embodiment in which one first electrode ELT1 and one second electrode ELT2 may be disposed in each light emitting area EMA, but the number and/or mutual arrangement structure of the first and second electrodes ELT1 and ELT2 disposed in each pixel PXL may be variously changed. For example, in another embodiment, multiple first electrodes ELT1 and/or second electrodes ELT2 may be disposed in the light emitting area EMA of each pixel PXL.

In case that multiple first electrodes ELT1 are disposed in one pixel PXL, the first electrodes ELT1 may be integrally or non-integrally connected to each other. For example, the first electrodes ELT1 may be integrally connected, or may be connected to each other by a bridge pattern positioned on a different layer (for example, a circuit layer on which the pixel circuit PXC may be disposed) from the first electrodes. Similarly, in case that multiple second electrodes ELT2 are disposed in one pixel PXL, the second electrodes ELT2 may be integrally or non-integrally connected to each other. For example, the second electrodes ELT2 may be integrally connected to each other, or may be connected to each other by a bridge pattern positioned on a different layer from the second electrodes. For example, the shape, number, arrangement direction, and/or mutual disposed relationship of the first and second electrodes ELT1 and ELT2 disposed in each pixel PXL may be variously changed.

The first electrode ELT1 may be electrically connected to a circuit element (for example, at least one transistor configuring the pixel circuit PXC), a power line (for example, the first power line PL1), and/or a signal line (for example, the scan line Si, the data line Dj, or a control line), through a first contact hole CH1. However, the invention is not necessarily limited thereto, and the first electrode ELT1 may be directly connected to a power wire or signal wire.

In an embodiment, the first electrode ELT1 may be electrically connected to a circuit element disposed thereunder through the first contact hole CH1, and to a first wire through the circuit element. The first wire may be a first power wire PL1 for supplying the first power source VDD, but is not limited thereto. For example, the first wire may be a signal wire to which a first driving signal (for example, a scan signal, a data signal, or a control signal) may be supplied.

The second electrode ELT2 may be electrically connected to a circuit element (for example, at least one transistor configuring the pixel circuit PXC), a power line (wire) (for example, the second power line (wire) PL2), and/or a signal line (for example, the scan line Si, the data line Dj, or a control line), through a second contact hole CH2. However, the invention is not necessarily limited thereto, and the second electrode ELT2 may be directly connected to a power wire or signal wire.

In an embodiment, the second electrode ELT2 may be electrically connected to the second wire disposed thereunder through the second contact hole CH2. The second wire may be a second power wire PL2 for supplying the second power source VSS, but is not limited thereto. For example, the second wire may be a signal wire to which a second driving signal (for example, a scan signal, a data signal, or a control signal) may be supplied.

Each of the first and second electrodes ELT1 and ELT2 may be configured of a single layer or multilayer. For example, each of the first and second electrodes ELT1 and ELT2 may include at least one reflective electrode layer including a reflective conductive material, and may optionally further include at least one transparent electrode layer and/or a conductive capping layer. The reflective conductive material may be at least one of various metal materials including a metal having a high reflectance in a visible light wavelength band, for example, aluminum (Al), gold (Au), and silver (Ag), but is not limited thereto.

The light emitting elements LD may be disposed between the first electrode ELT1 and the second electrode ELT2. For example, the light emitting elements LD may be connected in parallel between the first electrode ELT1 and the second electrode ELT2. For example, each light emitting element LD may be arranged between the first electrode ELT1 and the second electrode ELT2 in the first direction (X-axis direction), and thus may be electrically connected between the first and second electrodes ELT1 and ELT2.

Each light emitting element LD may include the first end portion EP1 disposed toward the first electrode ELT1 and the second end EP2 disposed toward the second electrode ELT2. In an embodiment, each light emitting element LD may overlap the first and/or second electrodes ELT1 and/or ELT2, or may not overlap the first and/or second electrodes ELT1 and/or ELT2. For example, the first end portion EP1 of the light emitting element LD may or may not overlap the first electrode ELT1. For example, the second end portion EP2 of the light emitting element LD may or may not overlap the second electrode ELT2.

In some embodiments, the first end portion EP1 of each of the light emitting elements LD may be connected to the first electrode ELT1, and the second end portion EP2 of each of the light emitting elements LD may be connected to the second electrode ELT2. For example, the first end portion EP1 of each of the light emitting elements LD may be electrically connected to the first electrode ELT1 through the first contact electrode CNE1, and the second end portion EP2 of each of the light emitting elements LD may be electrically connected to the second electrode ELT2 through the second contact electrode CNE2. In another embodiment, the first end portion EP1 of each of the light emitting elements LD may directly contact the first electrode ELT1, and thus, may be connected to the first electrode ELT1. Similarly, the second end portion EP2 of each of the light emitting elements LD may directly contact the second electrode ELT2, and thus, may be connected to the second electrode ELT2. The first contact electrode CNE1 and/or second contact electrode CNE2 may be selectively formed.

In some embodiments, the light emitting elements LD may be prepared in a form dispersed in a solution to be supplied to each pixel area (in particular, the light emitting area EMA of each pixel PXL) through various methods including an inkjet method or a slit coating method. For example, the light emitting elements LD may be mixed with a volatile solvent, and may be supplied to the light emitting area EMA of each pixel PXL. In case that an alignment voltage (or alignment signal) is applied to the first and second electrodes ELT1 and ELT2 of the pixels PXL, an electric field may be formed between the first and second electrodes ELT1 and ELT2, and thus, the light emitting elements LD may be aligned between the first and second electrodes ELT1 and ELT2. After the light emitting elements LD may be aligned, the light emitting elements LD may be stably arranged between the first and second electrodes ELT1 and ELT2 by volatilizing the solvent or eliminating it in other ways.

In some embodiments, the first contact electrode CNE1 and second contact electrode CNE2 may be formed on end portions of the light emitting elements LD, for example, the first and second end portions EP1 and EP2 thereof, respectively. Accordingly, the light emitting elements LD may be more stably connected between the first and second electrodes ELT1 and ELT2.

The first contact electrode CNE1 may be disposed on the first electrode ELT1 and the first end portion EP1 of the light emitting element LD so as to overlap the first electrode ELT1 and the first end portion EP1 of the at least one light emitting element LD adjacent to the first electrode. The first contact electrode CNE1 may electrically connect the first electrode ELT1 and the first end portions EP1 of the light emitting elements LD. The first contact electrode CNE1 may stably fix the first end portions EP1 of the light emitting elements LD. On the other hand, in another embodiment, in case that the first contact electrode CNE1 is not formed, the first end portions EP1 of the light emitting elements LD may be disposed to overlap the first electrode ELT1 adjacent thereto to be directly connected to the first electrode ELT1.

The second contact electrode CNE2 may be disposed on the second electrode ELT2 and the second end portion EP2 of the light emitting element LD so as to overlap the second electrode ELT2 and the second end portion EP2 of the at least one light emitting element LD adjacent to the second electrode. The second contact electrode CNE2 may electrically connect the second electrode ELT2 and the second end portions EP2 of the light emitting elements LD. The second contact electrode CNE2 may stably fix the second end portions EP2 of the light emitting elements LD. On the other hand, in another embodiment, in case that the second contact electrode CNE2 is not formed, the second end portions EP2 of the light emitting elements LD may be disposed to overlap the second electrode ELT2 adjacent thereto to be directly connected to the second electrode ELT2.

In the above-described embodiment, each light emitting element LD connected in a forward direction between the first and second electrodes ELT1 and ELT2 may form an effective light source of the corresponding pixel PXL. The effective light sources may be gathered to form the light source unit LSU of the corresponding pixel PXL.

Each pixel PXL may further include a first bank BNK1 overlapping the first electrode ELT1 and the second electrode ELT2 and a second bank BNK2 surrounding each light emitting area EMA.

The first bank BNK1 (also referred to as a "partition wall") may be disposed to overlap one area of the first and second electrodes ELT1 and ELT2. For example, the first bank BNK1 may be disposed under the first and second electrodes ELT1 and ELT2 so as to respectively overlap an area of the first and second electrodes ELT1 and ELT2 in a plan view. However, the invention is not necessarily limited thereto, and the first bank BNK1 may be disposed at upper portions of the first and second electrodes ELT1 and ELT2 so as to respectively overlap an area of the first and second electrodes ELT1 and ELT2 in a plan view.

The first bank BNK1 may be for forming a wall structure around the light emitting elements LD, and may be formed in a separate or integral pattern. For example, the first bank BNK1 may be configured of multiple separated banks, and one first bank BNK1 may overlap the first electrode ELT1 and the first contact electrode CNE1, and the other first bank BNK1 may overlap the second electrode ELT2 and the second contact electrode CNE2. However, the shape of the first bank BNK1 is not necessarily limited thereto, and the first bank BNK1 may have an opening or groove corresponding to an area in which the light emitting elements LD may be disposed, and may also have a shape surrounding the area in which the light emitting elements LD may be disposed. The first bank BNK1 may be disposed around the area in which the light emitting elements LD may be disposed so as to overlap one area of each of the first and second electrodes ELT1 and ELT2 and the second bank BNK2.

In case that the first bank BNK1 is disposed under one area of each of the first and second electrodes ELT1 and ELT2, the first and second electrodes ELT1 and ELT2 may protrude in an upper direction, for example, a third direction (Z-axis direction) in an area in which the first bank BNK1 may be formed. This first bank BNK1 may form a reflective bank (also referred to as a "reflective partition wall") together with the first and second electrodes ELT1, and ELT2. For example, the first and second electrodes ELT1 and ELT2 and/or the first bank BNK1 may be formed of a reflective material, or at least one material layer having a reflective characteristic may be formed on the protruding sidewalls of the first and second electrodes ELT1 and ELT2 and/or the first bank BNK1. Accordingly, the light emitted from the first and second end portions EP1 and EP2 of the light emitting elements LD facing the first and second electrodes ELT1 and ELT2 may be induced to be more directed toward a front direction of the display panel PNL. Here, the front direction of the display panel PNL may include a direction vertical to the display panel PNL (for example, the upper direction of the pixel PXL), and in addition, it may comprehensively mean a direction included in a viewing angle range. As such, in case that one area of the first and second electrodes ELT1 and ELT2 is protruded in the upper direction by using the first bank BNK1, a ratio of the light directed to the front direction of the display panel PNL with respect to the light generated from the pixel PXL may be increased, and thus, it may be possible to improve an optical efficiency of the pixel PXL.

In some embodiments, the first bank BNK may be disposed on the first and second electrodes ELT1 and ELT2. The first and second electrodes ELT1 and ELT2 may be formed to be substantially flat, or may be formed to have a protrusion and depression surface.

The second bank BNK2 may be a structure defining the light emitting area EMA of each pixel PXL, and may be, for example, a pixel defining layer. For example, the second bank BNK2 may be disposed in a boundary area of each pixel area PXA in which the pixel PXL is provided and/or in an area between the pixels PXL adjacent thereto so as to surround the light emitting area EMA of each pixel PXL.

The second bank BNK2 may include at least one light-blocking and/or reflective material to prevent light leakage between adjacent pixels PXL. For example, the second bank BNK2 may include at least one black matrix material (for example, at least one light-blocking material currently known) among various types of black matrix materials, and/or a color filter material of a specific color. For example, the second bank BNK2 may be formed in a black opaque pattern to block light transmission. In an embodiment, a reflective layer (not shown) may be formed on a surface (for example, a side wall) of the second bank BNK2 to further increase a light efficiency of the pixel PXL.

The second bank BNK2 may function as a dam structure that defines each light emitting area EMA in which the light emitting elements LD should be supplied at the step of supplying the light emitting elements LD to each pixel PXL. For example, each light emitting area EMA may be partitioned by the second bank BNK2, so that a desired type and/or amount of light emitting element ink may be supplied into the light emitting area EMA.

In an embodiment, the second bank BNK2 may be simultaneously formed in the same layer as the first banks BNK1 in the process of forming the first banks BNK1 of the pixels PXL. In another embodiment, the second bank BNK2 may be formed in the same or different layer as or from the first banks BNK1 through a separate process from the process of forming the first banks BNK1. For example, the second bank BNK2 may be formed above the first bank BNK1.

Figure 13:
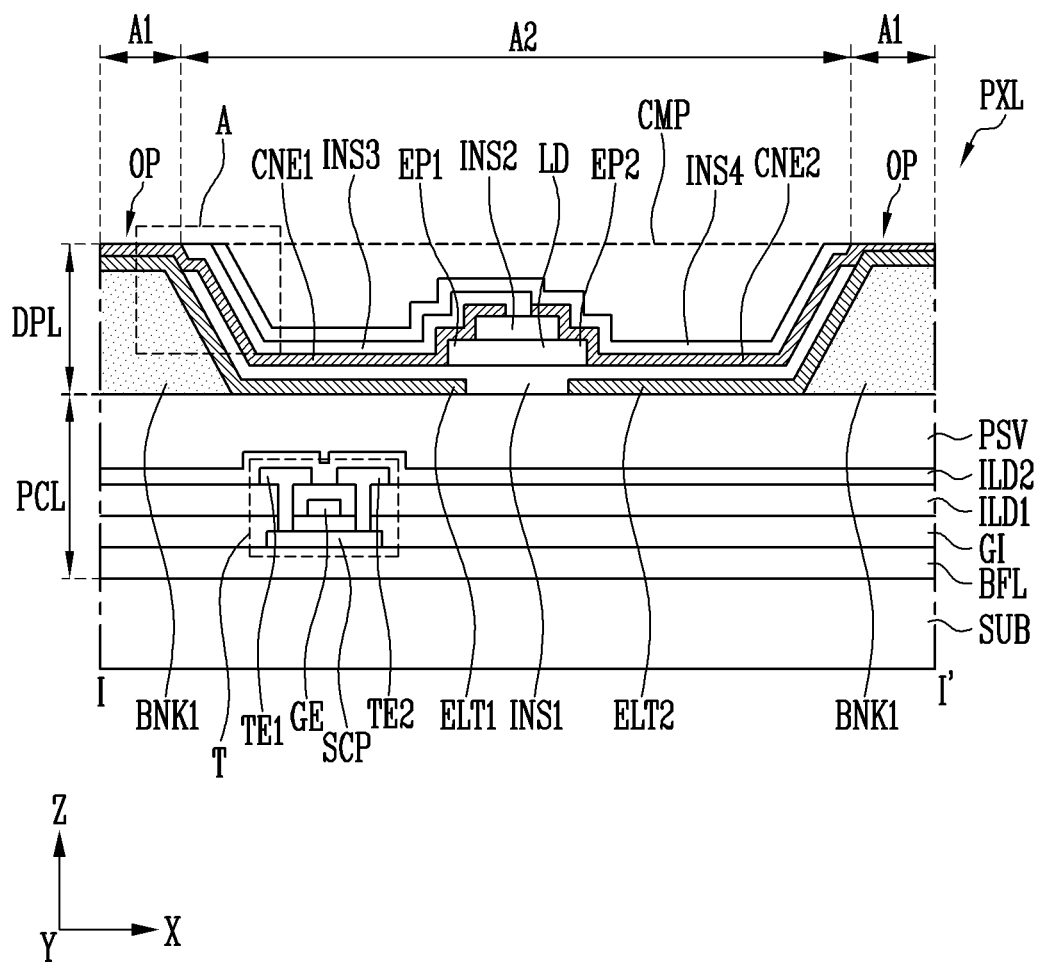
FIG. 13 illustrates a schematic cross-sectional view taken along line I-I' of FIG. 12.
Figure 14:
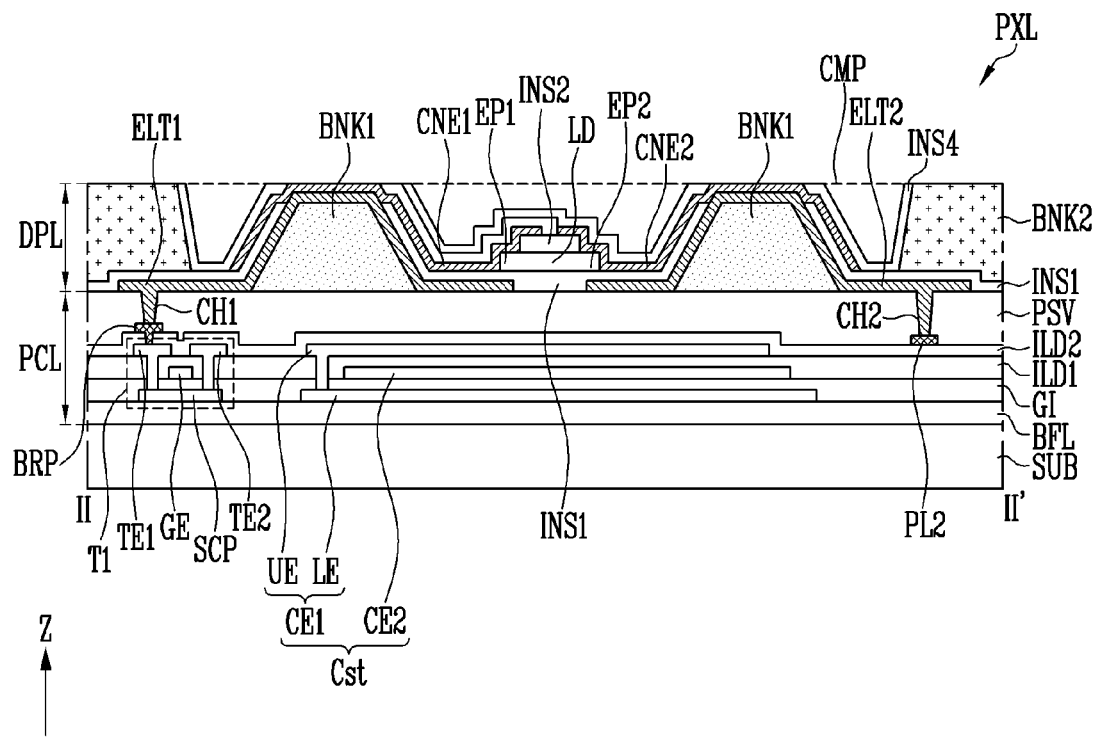
FIG. 14 illustrates a schematic cross-sectional view taken along line II-II' of FIG. 12.
Figure 15:
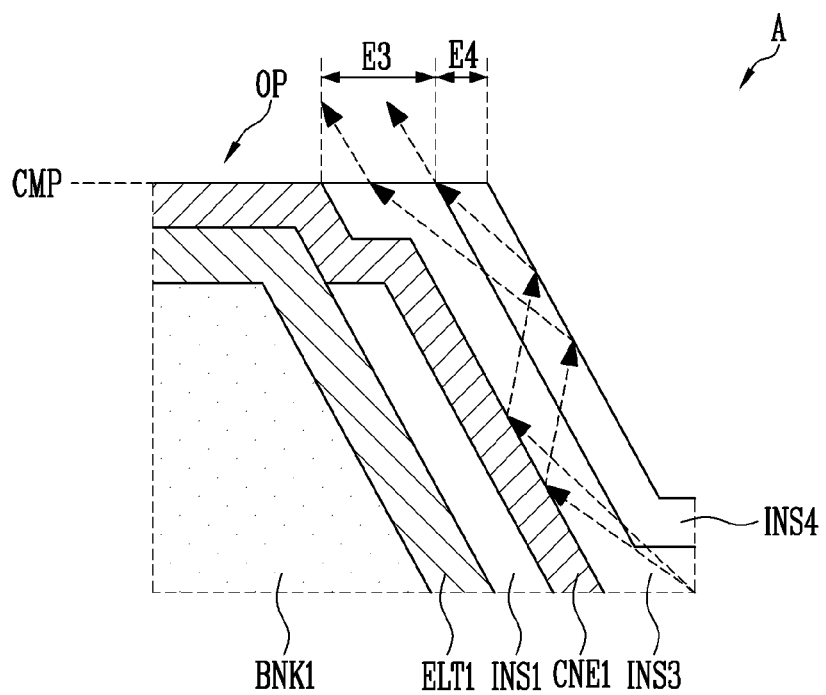
FIG. 15 illustrates an enlarged schematic view of area A of FIG. 13.

FIG. 13 illustrates a schematic cross-sectional view taken along line I-I' of FIG. 12. FIG. 14 illustrates a schematic cross-sectional view taken along line II-II' of FIG. 12. FIG. 15 illustrates an enlarged schematic view of area A of FIG. 13.

The pixels PXL may have substantially the same or similar cross-sectional structure, and to show various circuit elements forming the pixel circuit PXC, FIG. 13 illustrates an arbitrary transistor T among the circuit elements, and FIG. 14 illustrates a transistor T (for example, the first transistor T1 in FIG. 8) connected to the first electrode ELT1 and a storage capacitor Cst among the circuit elements. Hereinafter, when it is not necessary to separately specify the first transistor T1, the first transistor T1 will also be comprehensively referred to as a "transistor T".

Structures of the transistors T and the storage capacitor Cst and/or a position of each layer thereof are not limited to the embodiments shown in FIG. 13 and FIG. 14, and may be variously changed according to embodiments. In an embodiment, the transistors T included in each pixel circuit PXC may have substantially the same or similar structure to each other, but are not limited thereto. For example, in another embodiment, at least one of the transistors T included in the pixel circuit PXC may have a different cross-sectional structure from the remaining other transistors T, and/or may be disposed on a different layer.

Referring to FIG. 13 and FIG. 14, the pixel PXL and the display device including the same may include a substrate SUB, a circuit layer PCL dispose on one surface of the substrate SUB, and a display layer DPL dispose on the circuit layer PCL.

The circuit layer PCL may include circuit elements for configuring the pixel circuit PXC of each pixel PXL, and various wires connected to the circuit elements. The display layer DPL may include electrodes (for example, the first and second electrodes ELT1 and ELT2 and/or the first and second contact electrodes CNE1 and CNE2) and the light emitting elements LD, for configuring the light source unit LSU of each pixel PXL.

The circuit layer PCL may include at least one circuit element electrically connected to the light emitting elements LD of each pixel PXL. For example, the circuit layer PCL may include transistors T and a storage capacitor Cst that may be disposed in each pixel area PXA to form a pixel circuit PXC of a corresponding pixel PXL. The circuit layer PCL may further include at least one power wire and/or signal wire connected to each pixel circuit PXC and/or light source unit LSU. For example, the circuit layer PCL may include the first power wire PL1, the second power wire PL2, and the scan line Si and the data line Dj of each pixel PXL. On the other hand, in case that the pixel circuit PXC is omitted and the light source unit LSU of each pixel PXL is directly connected to the first and second power wires PL1 and PL2 (or signal wires), the circuit layer PCL may be omitted.

The circuit layer PCL may include insulation layers. For example, the circuit layer PCL may include a buffer layer BFL, a gate insulation layer GI, a first interlayer insulation layer ILD1, a second interlayer insulation layer ILD2, and/or a passivation layer PSV, sequentially stacked on one side of the substrate SUB. The circuit layer PCL may selectively further include at least one light blocking pattern (not shown) and the like disposed under at least some of the transistors T.

The buffer layer BFL may prevent impurities from diffusing into each circuit element. The buffer layer BFL may be formed as a single layer, but may also be formed as a multilayer of at least two layers or more. In case that the buffer layer BFL is provided as the multilayer, respective layers may be made of the same material or different materials. Various circuit elements such as the transistors T and the storage capacitor Cst, and various wires connected to the circuit elements may be disposed on the buffer layer BFL. In some embodiments, the buffer layer BFL may be omitted, and at least one circuit element and/or wire may be directly disposed on one surface of the substrate SUB.

Each transistor T may include a semiconductor pattern SCP (also referred to as a "semiconductor layer" or "active layer"), a gate electrode GE, first and second transistor electrodes TE1 and TE2. FIG. 13 and FIG. 14 illustrate an embodiment in which each transistor T includes the first and second transistor electrodes TE1 and TE2 formed separately from the semiconductor pattern SCP, but the invention is not necessarily limited thereto. For example, in another embodiment, the first and/or second transistor electrodes TE1 and/or TE2 provided in at least one transistor T may be integrated with each semiconductor pattern SCP.

The semiconductor pattern SCP may be disposed on the buffer layer BFL. For example, the semiconductor pattern SCP may be disposed between the substrate SUB on which the buffer layer BFL may be formed and the gate insulation layer GI. The semiconductor pattern SCP may include a first region contacting each first transistor electrode TE1, a second region contacting each second transistor electrode TE2, and a channel region disposed between the first and second regions. In some embodiments, one of the first and second regions may be a source region, and the other thereof may be a drain region.

In some embodiments, the semiconductor pattern SCP may be a semiconductor pattern made of polysilicon, amorphous silicon, an oxide semiconductor, or the like, or a combination thereof. The channel region of the semiconductor pattern SCP may be an intrinsic semiconductor as a semiconductor pattern that may not be doped with impurities, and each of the first and second regions of the semiconductor pattern SCP may be a semiconductor pattern doped with impurities.

In an embodiment, the semiconductor patterns SCP of the transistors T included in each pixel circuit PXC may be made of substantially the same or similar material. For example, the semiconductor pattern SCP of the transistors T may be of a material of polysilicon, amorphous silicon, an oxide semiconductor, or a combination thereof.

In another embodiment, one or more of the transistors T may include the semiconductor patterns SCP made of different materials. For example, the semiconductor pattern SCP of some of the transistors T may be made of polysilicon, amorphous silicon, or a combination thereof, and the semiconductor pattern SCP of the remaining transistors T may be made of an oxide semiconductor.

The gate insulation layer GI may be disposed on the semiconductor pattern SCP. For example, the gate insulation layer GI may be disposed between the semiconductor pattern SCP and the gate electrode GE. The gate insulation layer GI may be formed as a single layer or multilayer, and may include at least one inorganic insulation material and/or organic insulation material. For example, the gate insulation layer GI may include a silicon nitride (SiNx), a silicon oxide (SiOx), or a combination thereof, and various types of organic/inorganic insulation materials.

The gate electrode GE may be disposed on the gate insulation layer GI. For example, the gate electrode GE may be disposed to overlap the semiconductor pattern SCP with the gate insulation layer GI interposed therebetween. FIG. 13 and FIG. 14 illustrate a top-gate structure of a transistor T, but in another embodiment, the transistor T may have a bottom-gate structure. The gate electrode GE may be disposed to overlap the semiconductor pattern SCP under the semiconductor pattern SCP.

The first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be formed as a single layer or multilayer, and may include at least one inorganic insulation material and/or organic insulation material. For example, the first interlayer insulation layer ILD1 may include a silicon nitride (SiNx), a silicon oxide (SiOx), or a combination thereof, and various types of organic/inorganic insulation materials, and the materials included in the first interlayer insulation layer ILD1 are not particularly limited.

The first and second transistor electrodes TE1 and TE2 may be disposed on each semiconductor pattern SCP with at least one first interlayer insulation layer ILD1 therebetween. For example, the first and second transistor electrodes TE1 and TE2 may be disposed on different end portions of the semiconductor pattern SCP with the gate insulation layer GI and the first interlayer insulation layer ILD1 therebetween. The first and second transistor electrodes TE1 and TE2 may be electrically connected to each semiconductor pattern SCP. For example, the first and second transistor electrodes TE1 and TE2 may be connected to the first and second regions of the semiconductor pattern SCP through respective contact holes passing through the gate insulation layer GI and the first interlayer insulation layer ILD1. In some embodiments, one of the first and second transistor electrodes TE1 and TE2 may be a source electrode, and the other thereof may be a drain electrode.

At least one transistor T provided in the pixel circuit PXC may be connected to at least one pixel electrode. For example, the transistor T may be electrically connected to the first electrode ELT1 of the corresponding pixel PXL through a contact hole (for example, first contact hole CH1) and/or bridge pattern BRP passing through the passivation layer PSV.

The storage capacitor Cst includes a first capacitor electrode CE1 and a second capacitor electrode CE2 overlapping each other. Each of the first and second capacitor electrodes CE1 and CE2 may be configured of a single layer or multilayer. At least one of the first and second capacitor electrodes CE1 and CE2 may be disposed on the same layer as at least one electrode or the semiconductor pattern SCP configuring the first transistor T1.

For example, the first capacitor electrode CE1 may be configured as a multilayer electrode that includes a lower electrode LE disposed on the same layer as the semiconductor pattern SCP of the first transistor T1, and an upper electrode UE disposed on the same layer as the first and second transistor electrodes TE1 and TE2 of the first transistor T1 and electrically connected to the lower electrode LE. The second capacitor electrode CE2 may be configured as a single layer electrode that may be disposed on the same layer as the gate electrode of the first transistor T1 and may be disposed between the lower electrode LE and the upper electrode UE of the first capacitor electrode CE1. However, the structure and/or position of each of the first and second capacitor electrodes CE1 and CE2 may be variously changed. For example, in another embodiment, one of the first and second capacitor electrodes CE1 and CE2 may include a conductive pattern disposed on a layer different from the electrodes (for example, the gate electrode GE, and the first and second transistor electrodes TE1 and TE2) and the semiconductor pattern SCP that configure the first transistor T1. For example, the first capacitor electrode CE1 or the second capacitor electrode CE2 may have a single-layered or multi-layered structure including a conductive pattern disposed on the second interlayer insulation layer ILD2.

In an embodiment, at least one signal wire and/or power wire connected to each pixel PXL may be disposed on the same layer as one electrode of circuit elements included in the pixel circuit PXC. For example, the scan line Si of each pixel PXL may be disposed on the same layer as the gate electrodes GE of transistors T, and the data line Dj of each pixel PXL may be disposed on the same layer as the first and second transistor electrodes TE1 and TE2 of transistors T.

The first and/or second power wires PL1 and PL2 may be dispose on the same layer as or different layers from the gate electrodes GE or first and second transistor electrodes TE1 and TE2 of the transistors T. For example, the second power wire PL2 for supplying the second power source VSS may be disposed on the second interlayer insulation layer ILD2 to be at least partially covered by the passivation layer PSV. The second power wire PL2 may be electrically connected to the second electrode ELT2 of the light source unit LSU disposed on the passivation layer PSV through the second contact hole CH2 passing through the passivation layer PSV. However, the position and/or structure of the first and/or second power wires PL1 and PL2 may be variously changed. For example, in another embodiment, the second power line PL2 may be disposed on the same layer as the gate electrodes GE of the transistors T or the first and second transistor electrodes TE1 and TE2 to be electrically connected to the second electrode ELT2 through at least one bridge pattern (not shown) and/or the second contact hole CH2.

The second interlayer insulation layer ILD2 may be disposed at an upper portion of the first interlayer insulation layer ILD1, and may cover the first and second transistor electrodes TE1 and TE2 and/or storage capacitor Cst disposed on the first interlayer insulation layer ILD1. The second interlayer insulation layer ILD2 may be formed as a single layer or multilayer, and may include at least one inorganic insulation material and/or organic insulation material. For example, the second interlayer insulation layer ILD2 may include a silicon nitride (SiNx), a silicon oxide (SiOx), or a combination thereof, and various types of organic/inorganic insulation materials, and the materials included in the second interlayer insulation layer ILD2 are not particularly limited. The bridge pattern BRP, the first power wire PL1, and/or the second power wire PL2 for connecting at least one circuit element (for example, the first transistor T1) provided in the pixel circuit PXC to the first electrode ELT1 may be disposed on the second interlayer insulation layer ILD2. However, in some embodiments, the second interlayer insulation layer ILD2 may be omitted. The bridge pattern BRP of FIG. 14 may be omitted, and the second power wire PL2 may be disposed on a layer in which one electrode of the transistor T may be disposed.

The passivation layer PSV may be disposed on the circuit elements including the transistors T and the storage capacitor Cst, and/or on the wires including the first and second power wires PL1 and PL2. The passivation layer PSV may be formed as a single layer or multilayer, and may include at least one inorganic insulation material and/or organic insulation material. For example, the passivation layer PSV may include at least one organic insulation layer, and may substantially flatten a surface of the circuit layer PCL. The display layer DPL may be disposed on the passivation layer PSV.

The display layer DPL may be disposed on the circuit layer PCL.

The display layer DPL may include at least one pair of first electrodes ELT1 and second electrode ELT2 disposed in the light emitting area EMA of each pixel PXL and configuring each light source unit LSU, and at least one light emitting element LD connected between the first electrode ELT1 and the second electrode ELT2. FIG. 13 and FIG. 14 respectively illustrate one light emitting element LD disposed in each pixel PXL, but each pixel PXL may include multiple light emitting elements LD connected in a forward direction between the first and second electrodes ELT1 and ELT2 as in the embodiments of FIG. 8. Accordingly, hereinafter, assuming that the pixel PXL includes multiple light emitting elements LD, each embodiment will be described.

The display layer DPL may further include the first and second contact electrodes CNE1 and CNE2 for more stably connecting the light emitting elements LD between the first and second electrodes ELT1 and ELT2, the first bank BNK1 for upwardly protruding one area of each of the first and second electrodes ELT1 and ELT2 and/or the first and second contact electrodes CNE1 and CNE2, and the second bank BNK2 surrounding each light emitting area EMA. The display layer DPL may further include at least one conductive layer and/or an insulation layer.

The first bank BNK1 may be disposed on the circuit layer PCL. The first banks BNK1 may be formed in a separate or integral pattern. The first bank BNK1 may be protruded in a height direction of the substrate SUB, for example, a third direction (Z-axis direction).

The first bank BNK1 may have various shapes according to embodiments. In an embodiment, the first bank BNK1 may be a bank structure having a positive taper structure. For example, the first bank BNK1 may be formed to have an inclined surface inclined at an angle with respect to the substrate SUB as shown in FIG. 13 and FIG. 14. However, the invention is not necessarily limited thereto, and the first bank BNK1 may have a side wall having a curved surface or a step shape. For example, the first bank BNK1 may have a cross-section of a semicircle or semi-ellipse shape.

Electrodes and insulation layers disposed at an upper portion of the first bank BNK1 may have a shape corresponding to the first bank BNK1. For example, the first and second electrodes ELT1 and ELT2, and the first and second contact electrodes CNE1 and CNE2 may be disposed on an area of the first bank BNK1, and may include an inclined or curved surface having a shape corresponding to the shape of the first bank BNK1. Similarly, first, third, and/or fourth insulation layers INS1, INS3, and INS4 may be disposed on the first bank BNK1 to include inclined surfaces or curved surfaces having a shape corresponding to the shape of the first bank BNK1.

The first bank BNK1 may contain an insulation material including at least one inorganic material and/or an organic material. For example, the first bank BNK1 may include at least one layer of inorganic film that includes various inorganic insulation materials including a silicon nitride (SiNx) or a silicon oxide (SiOx). In another embodiment, the first bank BNK1 may include at least one layer of organic film and/or photo resist film that include various organic insulation materials, or may include a single-layered or multi-layered insulator complexly including organic/inorganic materials. For example, the material and/or pattern shape of the first bank BNK1 may be variously changed.

In an embodiment, the first bank BNK1 may function as a reflective member. For example, the first bank BNK1, along with the first and second electrodes ELT1 and ELT2 provided thereon, may function as a reflective member that guides the light emitted from each light emitting element LD in a desired direction (for example, an upper direction of the pixel PXL including the third direction (Z-axis direction)) to improve the light efficiency of the pixel PXL.

The first and second electrodes ELT1 and ELT2 included in the pixel electrodes of each pixel PXL may be disposed at the upper portion of the first bank BNK1. Each of the first and second electrodes ELT1 and ELT2 may contain at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO); and at least one conductive material among conductive polymers such as PEDOT, but are not limited thereto. For example, each of the first and second electrodes ELT1 and ELT2 may contain other conductive materials in addition to a carbon nanotube or graphene. Each of the first and second electrodes ELT1 and ELT2 may be configured of a single layer or multilayer. For example, each of the first and second electrodes ELT1 and ELT2 may include a reflective electrode layer containing a reflective conductive material. Each of the first and second electrodes ELT1 and ELT2 may selectively further include at least one of at least one transparent electrode layer disposed at an upper portion and/or a lower portion of the reflective electrode layer and at least one conductive capping layer covering an upper portion of the reflective electrode layer and/or the transparent electrode layer.

The first insulation layer INS1 may be disposed on an area of the first and second electrodes ELT1 and ELT2. For example, the first insulation layer INS1 may be formed to cover an area of each of the first and second electrodes ELT1 and ELT2, and may include an opening exposing another area of each of the first and second electrodes ELT1 and ELT2. For example, the first insulation layer INS1 may include an opening formed on an upper surface of the first bank BNK1. In the area in which the first insulation layer INS1 may be opened, the first and second electrodes ELT1 and ELT2 may be electrically connected to the first and second contact electrodes CNE1 and CNE2, respectively. In some embodiments, the first insulation layer INS1 may be omitted. The light emitting elements LD may be directly disposed on the passivation layer PSV and/or one end of each of first and second electrodes ELT1 and ELT2.

In an embodiment, the first insulation layer INS1 may be first formed to entirely cover the first and second electrodes ELT1 and ELT2. After the light emitting elements LD may be supplied and arranged on the first insulation layer INS1, the first insulation layer INS1 may be partially opened to expose an area of the first and second electrodes ELT1 and ELT2. For example, the insulation layer INS1 has an opening exposing an area of the first and second electrodes ELT1 and ELT2 on an upper surface of the first bank BNK1, and may at least partially cover the inclined or curved surfaces of the first and second electrodes ELT1 and ELT2. In another embodiment, the first insulation layer INS1 may be patterned in a form of an individual pattern that may be locally disposed only under the light emitting elements LD after the light emitting elements LD may be completely supplied and arranged. The first insulation layer INS1 may be formed to cover the first and second electrodes ELT1 and ELT2 after the first and second electrodes ELT1 and ELT2 may be formed. Accordingly, it may be possible to prevent the first and second electrodes ELT1 and ELT2 from being damaged in a subsequent process.

The first insulation layer INS1 may be formed as a single layer or multilayer, and may include at least one inorganic insulation material and/or organic insulation material. For example, the first insulation layer INS1 may include a silicon nitride (SiNx), a silicon oxide (SiOx), an aluminum oxide (AlOx), or a combination thereof, and various types of organic/inorganic insulation materials.

The light emitting elements LD may be provided and arranged on the first and second electrodes ELT1 and ELT2 and the first insulation layer INS1. Before the light emitting elements LD may be supplied, the second bank BNK2 may be formed around the light emitting area EMA. For example, the second bank BNK2 may be formed in the display area DA to surround each light emitting area EMA. In a case of the second bank BNK2, a position thereof may be variously changed in a cross-section view. In an embodiment, the second bank BNK2 may be formed on the first insulation layer INS1, but is not limited thereto. For example, in another embodiment, the second bank BNK2 may be disposed on the same layer as the first bank BNK1. The second bank BNK2 may or may not overlap the first bank BNK1.

The light emitting elements LD may be supplied to each pixel area PXA in which the first bank BNK1, the first and second electrodes ELT1 and ELT2, the first insulation layer INS1, the second bank BNK2, and the like may be formed to be arranged between the first and second electrodes ELT1 and ELT2. For example, light emitting elements LD may be supplied to the light emitting area EMA of each pixel PXL through an inkjet method, a slit coating method, or various other methods, and the light emitting elements LD may be aligned between the first and second electrodes ELT1 and ELT2 with directionality by an alignment signal (or alignment voltage) applied to each of the first and second electrodes ELT1 and ELT2.

In an embodiment, at least some of the light emitting elements LD may be disposed in a horizontal direction or an oblique direction between the pair of first and second electrodes ELT1 and ELT2 so that end portions thereof in a longitudinal direction (for example, the first and second end portions EP1 and EP2) overlap an adjacent pair of first and second electrodes ELT1 and ELT2. In another embodiment, at least some of the light emitting elements LD may be disposed so as to not overlap the first and/or second electrodes ELT1 and ELT2 between a pair of adjacent first and second electrodes ELT1 and ELT2, and may be electrically connected to the pair of first and second electrodes ELT1 and ELT2 through the first and second contact electrodes CNE1 and CNE2, respectively. For example, in some embodiments, the light emitting elements LD may or may not overlap the first and/or second electrodes ELT1 and ELT2, and may be electrically connected between the first and second electrodes ELT1 and ELT2 by the first and second contact electrodes CNE1 and CNE2.

The second insulation layer INS2 may be disposed on one area of the light emitting elements LD. For example, the second insulation layer INS2 may be disposed on one area of each of the light emitting elements LD to expose the first and second end portions EP1 and EP2 of each of the light emitting elements LD. For example, the second insulation layer INS2 may be locally disposed only at an upper portion of one area including a central area of each of the light emitting elements LD. In case that the second insulation layer INS2 is formed on the light emitting elements LD after the alignment of the light emitting elements LD is completed, it may be possible to prevent the light emitting elements LD from deviating from an aligned position.

The second insulation layer INS2 may be formed in an independent pattern in the light emitting area EMA of each pixel PXL, but is not limited thereto. In some embodiments, the second insulation layer INS2 may be omitted, and an end of each of the first and second contact electrodes CNE1 and CNE2 may be directly disposed on the upper surface of the light emitting elements LD.

The second insulation layer INS2 may be formed as a single layer or multilayer, and may include at least one inorganic insulation material and/or organic insulation material. For example, the second insulation layer INS2 may include a silicon nitride (SiNx), a silicon oxide (SiOx), an aluminum oxide (AlOx), a photo resist, various types of organic/inorganic insulation materials, or a combination thereof.

End portions of the light emitting elements LD that may not be covered by the second insulation layer INS2, for example, the first and second end portions EP1 and EP2, may be covered by the first and second contact electrodes CNE1 and CNE2 respectively. The first and second contact electrodes CNE1 and CNE2 may be formed to be spaced apart from each other. For example, the adjacent first and second contact electrodes CNE1 and CNE2 may be spaced apart from each other on the first and second end portions EP1 and EP2 of at least one adjacent light emitting element LD, with the second insulation layer INS2 therebetween.

The first and second contact electrodes CNE1 and CNE2 may be disposed at the upper position of the first and second electrodes ELT1 and ELT2 to cover the exposed area of each of the first and second electrodes ELT1 and ELT2. For example, the first and second contact electrodes CNE1 and CNE2 may be disposed on at least one area of each of the first and second electrodes ELT1 and ELT2 so as to be in direct/indirect contact with each of the first and second electrodes ELT1 and ELT2 at the upper portion of the first bank BNK1 or around the first bank BNK1. Accordingly, the first and second contact electrodes CNE1 and CNE2 may be electrically connected to the first and second electrodes ELT1 and ELT2, respectively. Accordingly, the first and second electrodes ELT1 and ELT2 may be electrically connected to the first or second end portions EP1 and EP2 of at least one light emitting element LD adjacent thereto through the first and second contact electrodes CNE1 and CNE2, respectively.

In an embodiment, the first and second contact electrodes CNE1 and CNE2 may be sequentially formed in different layers on one surface of the substrate SUB as shown in FIG. 13 and FIG. 14. The third insulation layer INS3 may be disposed between the first contact electrode CNE1 and the second contact electrode CNE2. The order of formation of the first and second contact electrodes CNE1 and CNE2 may be changed. For example, in another embodiment, before the first contact electrode CNE1 is formed, the second contact electrode CNE2 may be first formed, and the third insulation layer INS3 may be formed to cover the second contact electrode CNE2 and the second insulation layer INS2, and the first contact electrode CNE1 may be formed on an end portion of the third insulation layer INS3.

The first and second contact electrodes CNE1 and CNE2 may be made of various transparent conductive materials. For example, the first and second contact electrodes CNE1 and CNE2 may include at least one of various transparent conductive materials in addition to ITO, IZO, ITZO, ZnO, AZO, GZO, ZTO, GTO, FTO, or a combination thereof, and may be implemented to be substantially transparent or transflective to satisfy a light transmittance. Accordingly, the light emitted from the light emitting elements LD through each of the first and second ends EP1 and EP2 may pass through the first and second contact electrodes CNE1 and CNE2 to be emitted outside of the display panel PNL.

The third insulation layer INS3 may be disposed on the first contact electrode CNE1 to cover the first contact electrode CNE1. For example, the third insulation layer INS3 may be disposed on the second insulation layer INS2 and the first contact electrode CNE1 such that one end portion thereof may be interposed between the first contact electrode CNE1 and the second contact electrode CNE2. One end portion of the second contact electrode CNE2 may be disposed on one end portion of the third insulation layer INS3.

In case that the second and third insulation layers INS2 and INS3 are formed on the upper portion of the light emitting elements LD, electrical stability between the first and second end portions EP1 and EP2 of the light emitting elements LD may be secured. For example, the first and second contact electrodes CNE1 and CNE2 may be stably separated by the second and third insulation layers INS2 and INS3. Accordingly, it may be possible to effectively prevent a short circuit defect from occurring between the first and second end portions EP1 and EP2 of the light emitting elements LD.

The third insulation layer INS3 may be formed as a single layer or multilayer, and may include at least one inorganic insulation material and/or organic insulation material. For example, the third insulation layer INS2 may include a silicon nitride (SiNx), a silicon oxide (SiOx), an aluminum oxide (AlOx), a photo resist, various types of organic/inorganic insulation materials, or a combination thereof.

A fourth insulation layer INS4 may be disposed on the first and second contact electrodes CNE1 and CNE2 and/or the third insulation layer INS3. For example, the fourth insulation layer INS4 may cover the first and second banks BNK1 and BNK2, the first and second electrodes ELT1 and ELT2, the first, second, and/or third insulation layers INS1, INS2, and/or INS3, and the light emitting elements LD, and the first and second contact electrodes CNE1 and CNE2. The fourth insulation layer INS4 may include at least one layer of an inorganic layer and/or organic layer.

The fourth insulation layer INS4 may be formed as a single layer or multilayer, and may include at least one inorganic insulation material and/or organic insulation material. For example, the fourth insulation layer INS4 may include a silicon nitride (SiNx), a silicon oxide (SiOx), or an aluminum oxide (AlOx), various types of organic/inorganic insulation materials, or a combination thereof.

In an embodiment, the fourth insulation layer INS4 may include a thin film encapsulation layer of a multi-layered structure. For example, the fourth insulation layer INS4 may include a thin film encapsulation layer of a multi-layered structure that includes at least two inorganic insulation layers and at least one organic insulation layer interposed between the at least two inorganic insulation layers. However, the material and/or structure of the fourth insulation layer INS4 may be variously changed.

In case that light emitted from the end portions EP1 and EP2 of the light emitting element LD is totally reflected inside the insulation layer (for example, the third insulation layer INS3 and/or fourth insulation layer INS4) disposed at the upper portion thereof, it may not be emitted in the front direction of the display panel PNL, for example, in the third direction (Z-axis direction). For example, the front emission efficiency of the pixel PXL may be lowered. Accordingly, the display device according to an embodiment may include an opening OP that exposes one area of the insulation layer (for example, the third insulation layer INS3 and/or the fourth insulation layer INS4) disposed on the end portions EP1 and EP2 of the light emitting element LD, in order to improve the front emission efficiency of the pixel PXL. This will be described in detail with reference to FIG. 15.

FIG. 15 is an enlarged schematic view of area A of FIG. 13, and shows a path of light provided inside the third insulation layer INS3 and the fourth insulation layer INS4.

Referring to FIG. 13 to FIG. 15, the pixel PXL may include a first area A1 overlapping the first bank BNK1, and a second area A2 excluding the first area A1. The third insulation layer INS3 and/or the fourth insulation layer INS4 may include the opening OP exposing the first area A1. The opening OP of the third insulation layer INS3 and the fourth insulation layer INS4 may be an area in which the third insulation layer INS3 and/or the fourth insulation layer INS4 may be protruded by the first bank BNK1 and partially removed through a chemical mechanical polishing process. Accordingly, an edge E3 of the opening OP of the third insulation layer INS3 and an edge E4 of the opening OP of the fourth insulation layer INS4 may have a flat upper surface. For example, the edge E3 of the opening OP of the third insulation layer INS3 and the edge E4 of the opening OP of the fourth insulation layer INS4 may be disposed on the same flat surface as a polishing surface CMP. The polishing surface CMP may mean a flat surface formed by performing the above-described chemical mechanical polishing process. The edge E3 of the opening OP of the third insulation layer INS3 and the edge E4 of the opening OP of the fourth insulation layer INS4 may be parallel to an upper surface of the substrate SUB. For example, the edge E3 of the opening OP of the third insulation layer INS3 and the edge E4 of the opening OP of the fourth insulation layer INS4 may form a flat surface perpendicular to the third direction (Z-axis direction). As shown in FIG. 15, even if light incident to the third insulation layer INS3 and/or fourth insulation layer INS4 is totally internally reflected, the light may be emitted in the front direction of the display panel PNL from one end of the third and fourth insulation layers INS3 and INS4, for example, the edges E3 and E4 of the opening OP. For example, the front emission efficiency of the pixel PXL may be improved.

In an embodiment, the opening OP of the third and fourth insulation layers INS3 and INS4 may expose the upper surfaces of the first and second contact electrodes CNE1 and CNE2 of the first area A1. The upper surfaces of the first and second contact electrodes CNE1 and CNE2 may be disposed on the same flat surface as the polishing surface CMP. For example, the upper surfaces of the first and second contact electrodes CNE1 and CNE2 may be disposed on the same flat surface as the edges E3 and E4 of the opening OP of the third and fourth insulation layers INS3 and INS4.

In the process of polishing the third insulation layer INS3 and the fourth insulation layer INS4, the first and second contact electrodes CNE1 and CNE2 of the first area A1 may also be polished by a thickness. Accordingly, thicknesses of the first and second contact electrodes CNE1 and CNE2 of the first area A1 may be thinner than those of the first and second contact electrodes CNE1 and CNE2 of the second area A2. Here, the thickness of the electrode may mean a thickness in the third direction (Z-axis direction) from one surface of the electrode to the other surface of the electrode.

As described above, in case that the first and second contact electrodes CNE1 and CNE2 are formed of different conductive layers, thicknesses to be polished may be different according to respective conductive layers. Accordingly, the thickness of the first contact electrode CNE1 of the first area A1 and the thickness of the second contact electrode CNE2 of the first area A1 may be different from each other. For example, in case that the second contact electrode CNE2 is disposed on the first contact electrode CNE1, the thickness of the second contact electrode CNE2 of the first area A1 may be thinner than that of the first contact electrode CNE1 of the first area A1.

In some embodiments, a thickness of the second bank BNK2 may also be polished while the third insulation layer INS3 and the fourth insulation layer INS4 may be polished. The upper surface of the second bank BNK2 may be disposed on the same flat surface as the polishing surface CMP. For example, the upper surface of the second bank BNK2 may be disposed on the same flat surface as the edges E3 and E4 of the opening OP of the third and fourth insulation layers INS3 and INS4. As such, in case that the second bank BNK2 is polished, a thickness of the display panel PNL may be minimized due to decrease in the thickness of the second bank BNK2. Accordingly, in case that a separate light conversion layer or the like is disposed on the display panel PNL, it may be possible to minimize light loss and improve light efficiency.

According to the display device of an embodiment described above, the edges E3 and E4 of the opening OP of the third and fourth insulation layers INS3 and INS4 may be flatly formed to be a flat surface perpendicular to the third direction (Z-axis direction). Accordingly, even if the light incident to the third and fourth insulation layers INS3 and INS4 may be totally internally reflected, since the light may be emitted in the front direction of the display panel PNL from one end of the third and fourth insulation layers INS3 and INS4, for example, from the edges E3 and E4 of the opening OP, it may be possible to improve the front emission efficiency of the pixel PXL.

Hereinafter, another embodiment will be described. The same elements as those described above will be referred to with the same reference numerals in embodiments below, and redundant descriptions will be omitted or simplified.

Figure 16:
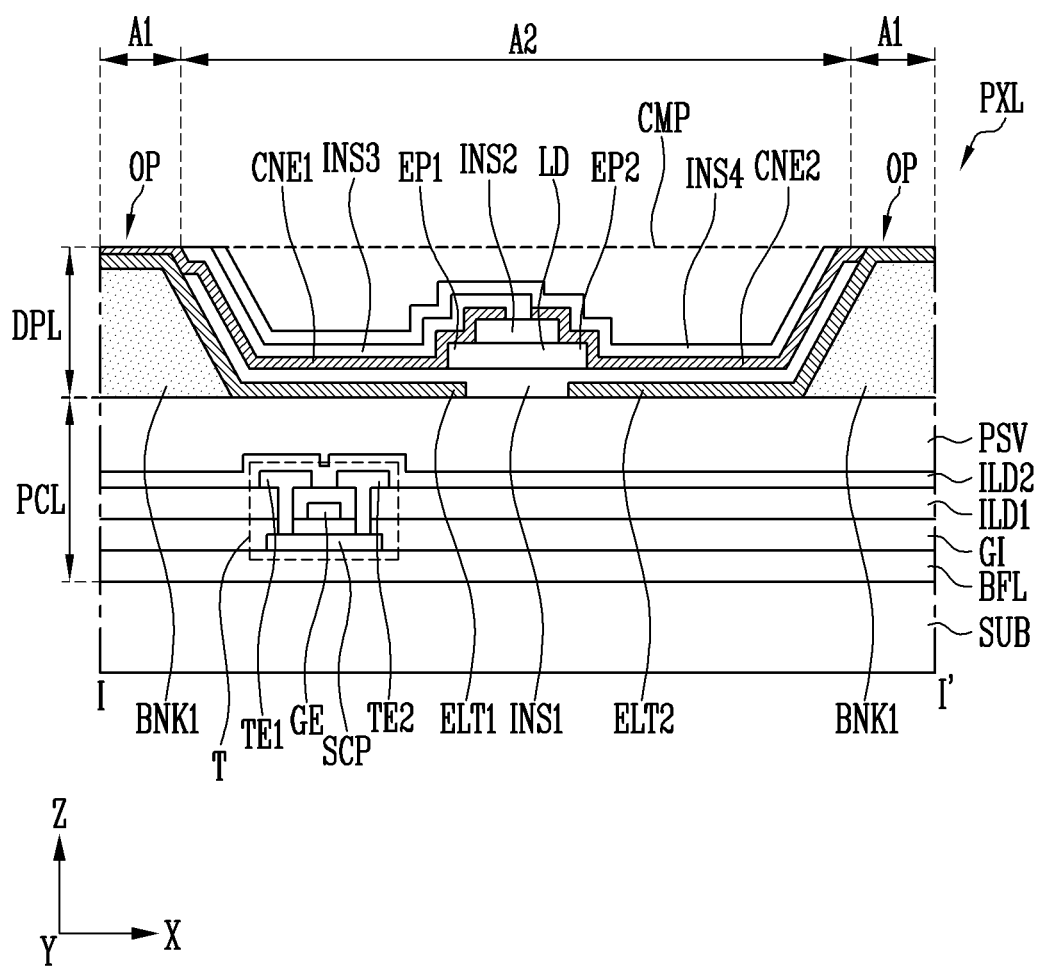
FIG. 16 illustrates a schematic cross-sectional view of a pixel according to another embodiment.

FIG. 16 illustrates a schematic cross-sectional view of a pixel according to another embodiment.

The pixel PXL according to an embodiment differs from that of the embodiments of FIG. 1 to FIG. 15 in that the opening OP of the third insulation layer INS3 and/or the fourth insulation layer INS4 may expose the upper surface of the first electrode ELT1 and/or the second electrode ELT2 of the first area A1.

Specifically, the opening OP of the fourth insulation layer INS4 may expose the upper surface of the second electrode ELT2. The upper surface of the second electrode ELT2 may be disposed on the same flat surface as the polishing surface CMP. For example, the upper surface of the second electrode ELT2 may be disposed on the same flat surface as the edges of the opening OP of the third and fourth insulation layers INS3 and INS4. The edges of the opening OP of the third and fourth insulation layers INS3 and INS4 may form a flat upper surface by polishing. For example, the edges of the opening OP of the third and fourth insulation layers INS3 and INS4 may form a flat surface vertical to the third direction (Z-axis direction). Even if the light incident to the third insulation layer INS3 and/or the fourth insulation layer INS4 may be totally internally reflected, as described above, the light may be emitted in the front direction of the display panel PNL from one end of the third and fourth insulation layers INS3 and INS4, for example, from the edges E3 and E4 of the opening OP to improve the front emission efficiency of the pixel PXL.

In the process of polishing the third insulation layer INS3 and the fourth insulation layer INS4, the second electrode ELT2 of the first area A1 may also be polished thickness-wise. Accordingly, the thickness of the second electrode ELT2 of the first area A1 may be thinner than that of the second electrode ELT2 of the second area A2.

FIG. 16 illustrates a case in which the second electrode ELT2 of the first area A1 may be exposed by the opening OP of the fourth insulation layer INS4, but the invention is not limited thereto. For example, in another embodiment, the first electrode ELT1 of the first area A1 may be exposed by the opening OP of the third and fourth insulation layers INS3 and INS4, and both the first and second electrode ELT1 and ELT2 of the first area A1 may be exposed.

Figure 17:
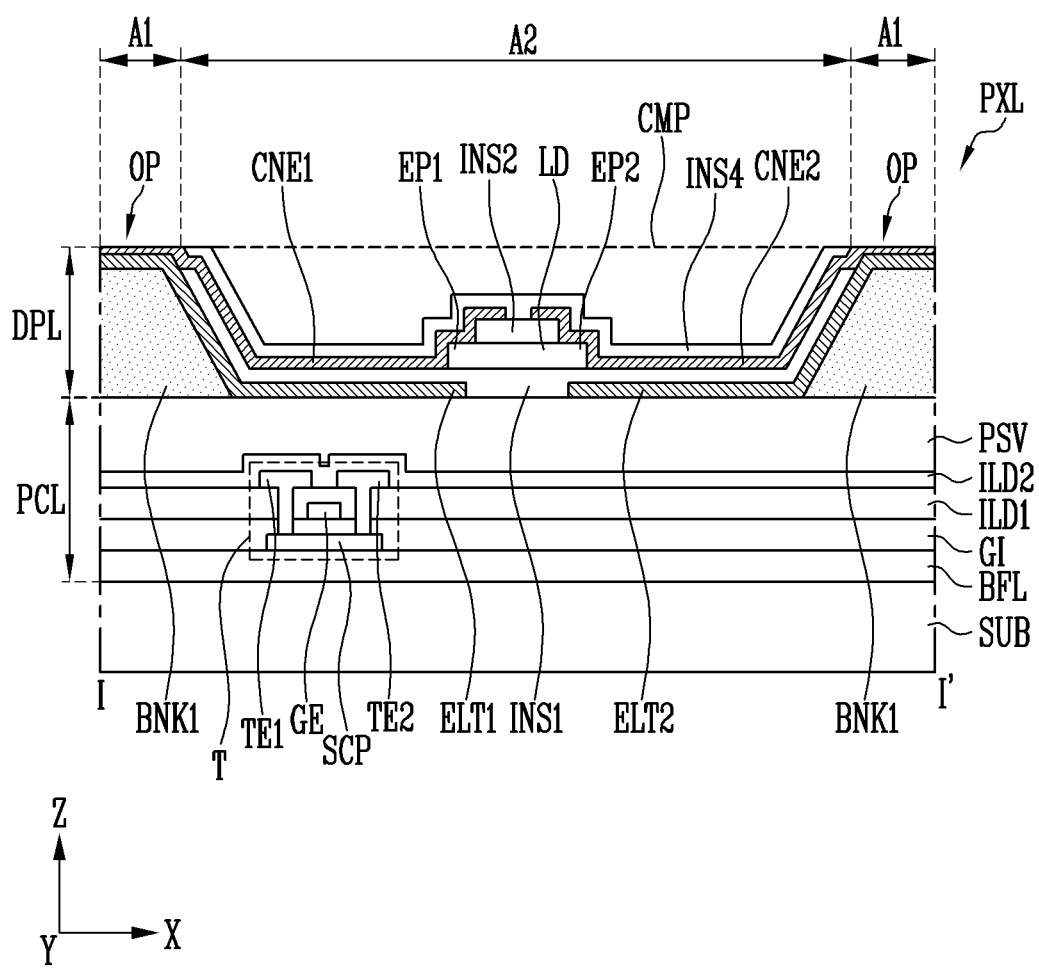
FIG. 17 illustrates a schematic cross-sectional view of a pixel according to another embodiment.

FIG. 17 illustrates a schematic cross-sectional view of a pixel according to another embodiment.

An embodiment may differ from the embodiments of FIG. 1 to FIG. 15 in that the first and second contact electrodes CNE1 and CNE2 of the pixel PXL may be disposed on the same layer.

Specifically, the first and second contact electrodes CNE1 and CNE2 may be formed on the same layer on one surface of the substrate SUB. The first and second contact electrodes CNE1 and CNE2 may be simultaneously formed in the same process. A manufacturing process of the pixel PXL and the display device including the same may be simplified. However, the invention is not necessarily limited thereto, and the first and second contact electrodes CNE1 and CNE2 may be sequentially formed.

The opening OP of the fourth insulation layer INS4 may expose the upper surfaces of the first and second contact electrodes CNE1 and CNE2 of the first area A1. The upper surfaces of the first and second contact electrodes CNE1 and CNE2 may be disposed on the same flat surface as the polishing surface CMP. For example, the upper surfaces of the first and second contact electrodes CNE1 and CNE2 may be disposed on the same flat surface as the edge of the opening OP of the fourth insulation layer INS4. The edge of the opening OP of the fourth insulation layer INS4 may form a flat upper surface by polishing. For example, the edge of the opening OP of the fourth insulation layer INS4 may form a flat surface vertical to the third direction (Z-axis direction). Even if the light incident to the fourth insulation layer INS4 may be totally internally reflected, as described above, the light may be emitted in the front direction of the display panel PNL from one end of the fourth insulation layer INS4, for example, from the edges E3 and E4 of the opening OP to improve the front emission efficiency of the pixel PXL.

In the process of polishing the fourth insulation layer INS4, the first and second contact electrodes CNE1 and CNE2 of the first area A1 may also be polished by a thickness. Accordingly, thicknesses of the first and second contact electrodes CNE1 and CNE2 of the first area A1 may be thinner than those of the first and second contact electrodes CNE1 and CNE2 of the second area A2.

In case that the first and second contact electrodes CNE1 and CNE2 are disposed on the same layer, thicknesses by which the first and second contact electrodes CNE1 and CNE2 may be polished may be substantially the same. For example, the thickness of the first contact electrode CNE1 of the first area A1 may be substantially the same as the thickness of the second contact electrode CNE2 of the first area A1.

Figure 18:
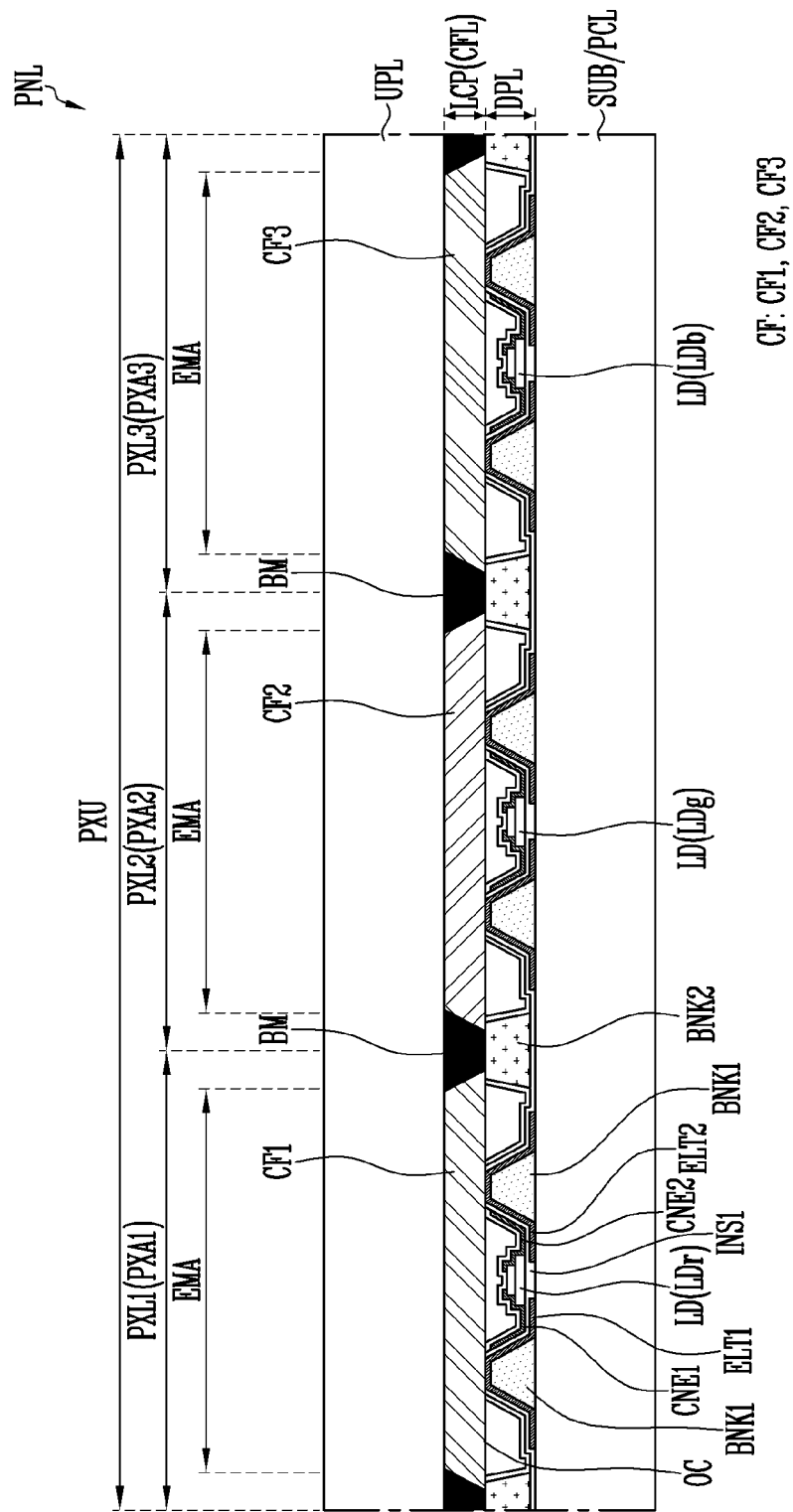
FIG. 18 and FIG. 19 illustrate schematic cross-sectional views of a display device according to embodiments.
Figure 19:
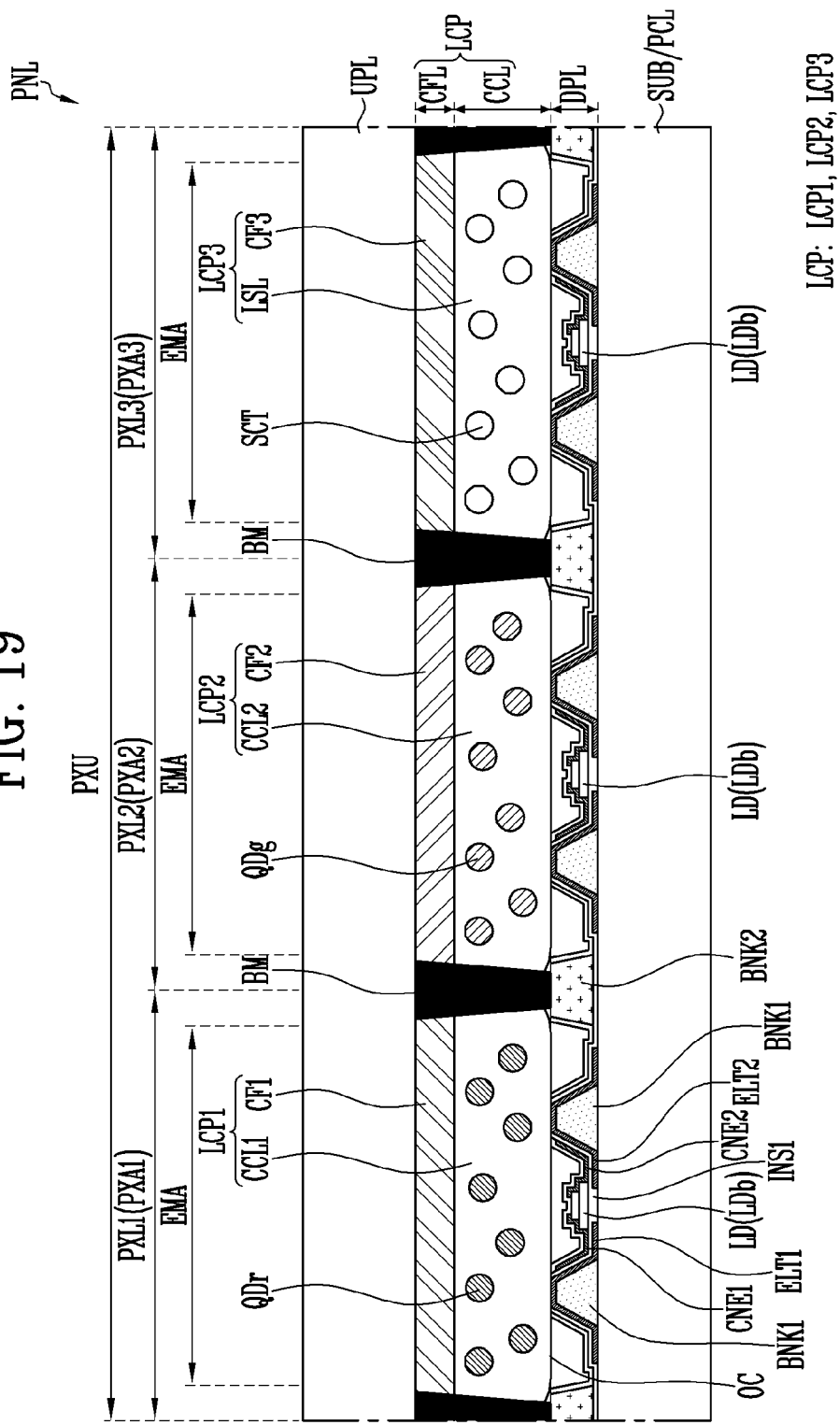

FIG. 18 and FIG. 19 illustrate schematic cross-sectional views of a display device according to embodiments.

The display device according to an embodiment may further include color conversion particles disposed at the upper portion of the pixels PXL. For example, FIG. 18 illustrates an embodiment of a display panel PNL that does not include color conversion particles (for example, red and green quantum dots QDr and QDg), and FIG. 19 illustrates an embodiment of a display panel PNL including the color conversion particles.

For convenience, FIG. 18 and FIG. 19 illustrate different cross-sectional views from each other with respect to one area of the display panel PNL including the pixel PXL according to an embodiment of FIG. 13. However, the pixel PXL may have a structure of another embodiment among the above-described embodiments in addition to that of an embodiment of FIG. 13.

FIG. 18 and FIG. 19 illustrate cross-sectional views of the display panel PNL, focusing on an area in which one pixel unit PXU including a first color pixel PXL1, a second color pixel PXL2, and a third color pixel PXL3 adjacent to each other may be disposed. However, since the structure of an embodiment of each pixel PXL has been described in detail through the above-described embodiments, the structure of each pixel PXL will be schematically illustrated below based on one light emitting element LD.

First, referring to FIG. 18, the light source unit LSU of each pixel PXL may be disposed in the display layer DPL on the substrate SUB and/or the circuit layer PCL. For example, in each light emitting area EMA of the display layer DPL, the light source unit LSU of the corresponding pixel PXL may be disposed. The second bank BNK2 for partitioning each light emitting area EMA may be disposed between adjacent light emitting areas EMA.

In the light emitting area EMA of each pixel PXL, the light source unit LSU, which may be various configured according to embodiments, may be formed. For example, in each light emitting area EMA, the first bank BNK1, the first and second electrodes ELT1 and ELT2, the light emitting elements LD, the first and second contact electrodes CNE1 and CNE2, insulation layers, and an overcoat layer OC may be disposed.

The first, second, and third color pixels PXL1, PXL2, and PXL3 may have light emitting elements LD that may emit light of different colors. For example, the first color pixel PXL1 may include a first color light emitting element LDr, the second color pixel PXL2 may include a second color light emitting element LDg, and the third color pixel PXL3 may include a third color light emitting element LDb. In some embodiments, the first color light emitting element LDr, the second color light emitting element LDg, and the third color light emitting element LDb may be a red light emitting element, a green light emitting element, and a blue light emitting element respectively, but the invention is not limited thereto.

The second bank BNK2 may be disposed in boundary areas of the first, second, and third color pixel areas PXA1, PXA2, and PXA3 so as to surround the light emitting area EMA of each pixel PXL. Hereinafter, when referring to an arbitrary pixel area among the first, second, and third color pixel areas PXA1, PXA2, and PXA3, or when comprehensively referring to two or more thereof, it will be referred to as "pixel area PXA" or "pixel areas PXA".

An upper substrate UPL may be disposed on the pixels PXL. For example, the upper substrate UPL (also referred to as "encapsulation substrate" or "color filter substrate") that encapsulates at least display area DA may be disposed on one surface of the substrate SUB in which the pixels PXL may be disposed.

The upper substrate UPL may selectively include a light conversion layer LCP overlapping the pixels PXL. For example, the light conversion layer LCP including a color filter layer CFL may be disposed on one surface of the upper substrate UPL facing the pixels PXL.

The color filter layer CFL may include a color filter that matches the color of each pixel PXL. For example, the color filter layer CFL may include a first color filter CF1 disposed in the first color pixel PXL1 to selectively transmit light generated by the first color pixel PXL1, a second color filter CF2 disposed in the second color pixel PXL2 to selectively transmit light generated by the second color pixel PXL2, and a third color filter CF3 disposed in the third color pixel PXL3 to selectively transmit light generated by the third color pixel PXL3. In an embodiment, the first color filter CF1, the second color filter CF2, and the third color filter CF3 may be a red color filter, a green color filter, and a blue color filter, respectively, but the invention is not limited thereto. Hereinafter, when referring to one of the first color filter CF1, the second color filter CF2, and the third color filter CF3, or when comprehensively referring to two or more thereof, it will be referred to as the "color filter CF" or "color filters CF".

The first color filter CF1 may include a color filter material that may be disposed between the first color pixel PXL1 and the upper substrate UPL, and selectively transmits light of the first color generated by the first color pixel PXL1. For example, in case that the first color pixel PXL1 is a red pixel, the first color filter CF1 may include a red color filter material.

The second color filter CF2 may include a color filter material that may be disposed between the second color pixel PXL2 and the upper substrate UPL, and selectively transmits light of the second color generated by the second color pixel PXL2. For example, in case that the second color pixel PXL2 is a green pixel, the second color filter CF2 may include a green color filter material.

The third color filter CF3 may include a color filter material that may be disposed between the third color pixel PXL3 and the upper substrate UPL, and selectively transmits light of the third color generated by the third color pixel PXL3. For example, in case that the third color pixel PXL3 is a blue pixel, the third color filter CF3 may include a blue color filter material.

A black matrix BM may be disposed between the color filters CF1, CF2, CF3. For example, the black matrix BM may be disposed on one surface of the upper substrate UPL so as to face the second bank BNK2. The black matrix BM may be disposed in boundary areas of the pixel areas PXA so as to not cover each light emitting area EMA.

The black matrix BM may include at least one black matrix material (for example, at least one light-blocking material currently known) among various types of black matrix materials, and/or a color filter material of a specific color. The black matrix BM may be made of the same material as that of the second bank BNK2, but is not limited thereto. For example, the black matrix BM and the second bank BNK2 may include the same material, or different materials.

In an embodiment, a space between a lower panel of the display panel PNL including the substrate SUB and the display layer DPL and an upper panel of the display panel PNL including the upper substrate UPL and the light conversion layer LCP may be filled with the overcoat OC having a relatively low refractive index in a range of approximately 1 to approximately 1.6. In another embodiment, the space between the lower panel and the upper panel of the display panel PNL may be filled with a layer of air.

FIG. 18 illustrates an embodiment in which the upper substrate UPL may be disposed on the substrate SUB in which pixels PXL may be disposed, but the invention is not limited thereto. For example, the pixels PXL may be sealed by using a thin film encapsulation layer or the like. The color filters CF1, CF2, CF3 and/or the black matrix BM may be selectively provided in a window (not shown) disposed on the display panel PNL.

Referring to FIG. 19, the light conversion layer LCP may include the color filter layer CFL and/or a color conversion layer CCL that may be disposed on the upper substrate UPL to face the pixels PXL. The color conversion layer CCL may be disposed between the color filter layer CFL and the pixels PXL, and may include respective color conversion particles.

The light conversion layer LCP may include a first light conversion layer LCP1 disposed in the first color pixel PXL1, a second light conversion layer LCP2 disposed in the second color pixel PXL2, and a third light conversion layer LCP3 disposed in the third color pixel PXL3. Hereinafter, when referring to one of the first light conversion layer LCP1, the second light conversion layer LCP2, and the third light conversion layer LCP3, or when comprehensively referring to two or more thereof, it will be referred to as the "light conversion layer LCP" or "light conversion layers LCP".

At least some of the first, second, and third light conversion layers LCP1, LCP2, and LCP3 may include the color conversion layer CCL and/or the color filter layer CFL that correspond to a color. For example, the first light conversion layer LCP1 may include at least one of a first color conversion layer CCL1 including first color conversion particles corresponding to a first color and a first color filter CF1 selectively transmitting light of the first color. Similarly, the second light conversion layer LCP2 may include at least one of a second color conversion layer CCL2 including second color conversion particles corresponding to a second color and a second color filter CF2 selectively transmitting light of the second color. The third light conversion layer LCP3 may include at least one of a light scattering layer LSL including light scattering particles SCT and a third color filter CF3 selectively transmitting light of a third color.

In an embodiment, at least one insulation layer (not shown) may be disposed on a surface of each of the first color conversion layer CCL1, the second color conversion layer CCL2, and/or the light scattering layer LSL. For example, between the first color conversion layer CCL1, the second color conversion layer CCL2, and/or the light scattering layer LSL and each color filter CF, and/or on the surface of each of the first color conversion layer CCL1, the second color conversion layer CCL2, and/or the light scattering layer LSL, each insulation layer (for example, a capping layer, a buffer layer, and/or a barrier layer) for protecting the first color conversion layer CCL1, the second color conversion layer CCL2, and/or the light scattering layer LSL may be disposed.

In an embodiment, the first, second, and third color pixels PXL1, PXL2, and PXL3 may include the light emitting elements LD that emit light of the same color. For example, the first color, second color, and third color pixels PXL1, PXL2, and PXL3 may include third color light emitting elements LDb that emit blue light in a wavelength band of approximately 400 nm to approximately 500 nm. The color conversion layer CCL including at least one type of color conversion particles may be disposed on at least some of the pixels PXL among the first, second, and third color pixels PXL1, PXL2, and PXL3. Accordingly, the display device according to an embodiment may display a full-color image.

The first color conversion layer CCL1 may include first color conversion particles that convert light of the third color emitted from the third color light emitting element LDb into light of the first color. For example, in case that the third light emitting element LDb is a blue light emitting element that emits blue light and the first color pixel PXL1 is a red pixel, the first color conversion layer CCL1 may include a red quantum dot QDr that converts blue light emitted from the blue light emitting element into red light. For example, the first color conversion layer CCL1 may include red quantum dots QDr dispersed in a matrix material such as a transparent resin. The red quantum dot QDr may absorb blue light and shift a wavelength thereof according to energy transition to emit red light in a wavelength band of approximately 620 nm to approximately 780 nm. In case that the first color pixel PXL1 is a pixel of a different color, the first color conversion layer CCL1 may include a first quantum dot corresponding to a color of the first color pixel PXL1.

The second color conversion layer CCL2 may include second color conversion particles that convert light of the third color emitted from the third color light emitting element LDb into light of the second color. For example, in case that the third light emitting element LDb is a blue light emitting element that emits blue light and the second color pixel PXL2 is a green pixel, the second color conversion layer CCL2 may include a green quantum dot QDg that converts blue light emitted from the blue light emitting element into green light. For example, the second color conversion layer CCL2 may include green quantum dots QDg dispersed in a matrix material such as a transparent resin. The green quantum dot QDg may absorbs blue light and shift a wavelength thereof according to energy transition to emit green light in a wavelength band of approximately 500 nm to approximately 570 nm. In case that the second color pixel PXL2 is a pixel of a different color, the second color conversion layer CCL2 may include a second quantum dot corresponding to a color of the second color pixel PXL2.

Each of the first and second quantum dots (for example, the red quantum dots QDr and the green quantum dots QDg) may be selected from a group II-IV compound, a group IV-VI compound, a group IV element, a group IV compound, or a combination thereof, but is not limited thereto.

The first and second quantum dots may have a full width of half maximum (FWHM) of a light emitting wavelength spectrum of approximately 45 nm or less, and light emitted through the first and second quantum dots may be emitted in a front direction. Accordingly, a viewing angle of the display device may be improved.

The first quantum dot and the second quantum dot may have a shape of a spherical, pyramidal, and multi-arm, or a cube of a nano particle, a nanotube, a nano wire, a nano fiber, a nano plate-shaped particle, etc., but the invention is not limited thereto. For example, the shapes of the first quantum dot and the second quantum dot may be variously changed.

In an embodiment, blue light having a relatively short wavelength among the visible ray bands may be incident on the red quantum dot QDr and the green quantum dot QDg, respectively, thereby increasing an absorption coefficient of the red quantum dot QDr and the green quantum dot QDg. Accordingly, the efficiency of light emitted from the first color pixel PXL1 and the second color pixel PXL2 may be finally increased, and excellent color reproducibility may be secured. The light source unit LSU of the first color, second color, and third color pixels PXL1, PXL2, and PXL3 may be configured by using the light emitting elements LD of the same color (for example, the third color light emitting elements LDb), thereby increasing the manufacturing efficiency of the display device.

The light scattering layer LSL may be disposed between the third color pixel PXL3 and the third color filter CF3. In case that the third color light emitting element LDb is a blue light emitting element that emits blue light and the third color pixel PXL3 is a blue pixel, the light scattering layer LSL may be optionally provided in order to efficiently use the light emitted from the third color light emitting element LDb. The light scattering layer LSL may include at least one type of light scattering particles SCT.

For example, the light scattering layer LSL may include light scattering particles SCT dispersed in a matrix material such as a transparent resin. For example, the light scattering layer LSL may include the light scattering particles SCT such as a titanium dioxide TiO2 or silica, but materials included in the light scattering particles SCT are not limited thereto. On the other hand, the light scattering particles SCT need not be disposed only in the third pixel area PXA3 in which the third color pixel PXL3 may be formed. For example, the light scattering particles SCT may be selectively included in the first and/or second color conversion layers CCL1 and CCL2.

In an embodiment, the black matrix BM may be disposed between the first color conversion layer CCL1, the second color conversion layer CCL2, and the light scattering layer LSL. For example, the black matrix BM may be a single-layered or multi-layered structural pattern having a thickness corresponding to a total thickness of the light conversion layer LCP including the color filter layer CFL and the color conversion layer CCL (for example, a thickness substantially the same or similar to the total thickness of the light conversion layer LCP). In case that the black matrix BM is disposed to be able to partition areas in which the first color conversion layer CCL1, the second color conversion layer CCL2, and the light scattering layer LSL may be formed, the first color conversion layer CCL1, the second color conversion layer CCL2, and/or the light scattering layer LSL may be formed through an inkjet method or the like.

Those skilled in the art related to the embodiments will readily appreciate that many modifications are possible without materially departing from the novel teachings and advantages. an embodiments should be considered in a descriptive sense only and not for purposes of limitation. The scope of the invention is given in the appended claims including equivalents thereof.

What is claimed is:
1. A display device comprising:
a substrate including pixels;
a first electrode and a second electrode spaced apart from each other;
light emitting elements disposed between the first electrode and the second electrode;
an insulation layer disposed on the light emitting elements;
a first bank overlapping the first electrode and the second electrode;
a first area overlapping the first bank; and
a second area excluding the first area,
wherein the insulation layer is further disposed on a portion of the first bank and includes an opening on an upper surface of the first bank exposing the first area.
2. The display device of claim 1, wherein
an edge of the opening of the insulation layer is parallel to an upper surface of the substrate.
3. The display device of claim 1, further comprising
a second bank disposed at boundaries of the pixels,
wherein an edge of the opening of the insulation layer and an upper surface of the second bank are disposed on a same surface, and
at least one of a color filter layer and a conversion layer overlaps at least one of the pixels.
4. The display device of claim 1, wherein
the opening of the insulation layer exposes the second electrode.
5. The display device of claim 4, wherein
an edge of the opening of the insulation layer and an upper surface of the second electrode are disposed on a same surface.
6. The display device of claim 1, further comprising
a first contact electrode contacting the first electrode and an end of the light emitting element; and
a second contact electrode contacting the second electrode and another end of the light emitting element.

7. The display device of claim 6, wherein
a thickness of the first contact electrode in the first area is greater than a thickness of the second contact electrode in the first area.

8. The display device of claim 6, wherein
a thickness of the second contact electrode in the first area is less than a thickness of the second contact electrode in the second area.

9. The display device of claim 6, wherein
the opening of the insulation layer exposes the second contact electrode.

10. The display device of claim 6, wherein
the opening of the insulation layer exposes the first contact electrode.

11. The display device of claim 10, wherein
an edge of the opening of the insulation layer and an upper surface of the first contact electrode are disposed on a same surface.

12. The display device of claim 6, wherein
the opening of the insulation layer exposes the first contact electrode and the second contact electrode.

13. The display device of claim 12, wherein
an edge of the opening of the insulation layer, an upper surface of the first contact electrode, and an upper surface of the second contact electrode are disposed on a same surface.

14. The display device of claim 12, wherein
a thickness of the first contact electrode in the first area is less than a thickness of the first contact electrode in the second area, and
the thickness of the first contact electrode in the first area is substantially same as a thickness of the second contact electrode in the first area.

15. The display device of claim 6, wherein
the insulation layer includes a first insulation layer disposed between the first contact electrode and the second contact electrode; and
a second insulation layer disposed on the first contact electrode and the second contact electrode.

16. The display device of claim 15, wherein
the opening of the first insulation layer exposes the first contact electrode.

17. The display device of claim 15, wherein
the opening of the second insulation layer exposes the second contact electrode.

18. The display device of claim 15, wherein
the opening of the second insulation layer exposes the second electrode.

19. The display device of claim 15, wherein
an edge of the opening of the first insulation layer and an edge of the opening of the second insulation layer are disposed on a same surface.

20. The display device of claim 15, wherein
an edge of the opening of the first insulation layer and an edge of the opening of the second insulation layer are parallel to an upper surface of the substrate.

* * * * *